(12) United States Patent
Shin et al.

(10) Patent No.: US 11,777,525 B2
(45) Date of Patent: Oct. 3, 2023

(54) METHOD FOR TRANSMITTING LDPC CODE USING ROW-ORTHOGONAL AND APPARATUS THEREFOR

(71) Applicant: LG Electronics Inc., Seoul (KR)

(72) Inventors: Jongwoong Shin, Seoul (KR); Bonghoe Kim, Seoul (KR); Jinwoo Kim, Seoul (KR); Ilmu Byun, Seoul (KR)

(73) Assignee: LG Electronics Inc., Seoul (KR)

( * ) Notice: Subject to any disclaimer, the term of this patent is extended or adjusted under 35 U.S.C. 154(b) by 189 days.

(21) Appl. No.: 17/339,418

(22) Filed: Jun. 4, 2021

(65) Prior Publication Data

US 2021/0297091 A1    Sep. 23, 2021

Related U.S. Application Data

(63) Continuation of application No. 16/065,542, filed as application No. PCT/KR2018/001505 on Feb. 5, 2018, now Pat. No. 11,043,970.

(60) Provisional application No. 62/455,478, filed on Feb. 6, 2017, provisional application No. 62/518,609, filed on Jun. 13, 2017.

(51) Int. Cl.
*H03M 13/11* (2006.01)
*H03M 13/00* (2006.01)
*H04L 1/00* (2006.01)

(52) U.S. Cl.
CPC ....... *H03M 13/116* (2013.01); *H03M 13/616* (2013.01); *H04L 1/0057* (2013.01)

(58) Field of Classification Search
CPC ............. H03M 13/116; H03M 13/616; H03M 13/1188; H03M 13/618; H03M 13/6306; H03M 13/6362; H03M 13/036; H03M 13/1162; H03M 13/35; H03M 13/6502; H03M 13/6508; H04L 1/0057
USPC .................................................. 714/776, 716
See application file for complete search history.

(56) References Cited

U.S. PATENT DOCUMENTS

| | | |
|---|---|---|
| 7,581,157 B2 | 8/2009 | Oh et al. |
| 2004/0034828 A1 | 2/2004 | Hocevar |
| 2009/0204868 A1 | 8/2009 | Park et al. |

(Continued)

FOREIGN PATENT DOCUMENTS

| | | |
|---|---|---|
| CN | 101490964 | 7/2009 |
| CN | 101640543 | 2/2010 |

(Continued)

OTHER PUBLICATIONS

AU Office Action in Australian Appln. No. 2020210204, dated Feb. 27, 2021, 6 pages.

(Continued)

*Primary Examiner* — Juan A Torres
(74) *Attorney, Agent, or Firm* — Fish & Richardson P.C.

(57) ABSTRACT

A method for encoding a quasi-cyclic low-density parity-check (LDPC) code according to an embodiment of the present invention may comprise the steps of: generating a multi-edge LDPC code matrix including a high rate code matrix and a single parity check code matrix; and encoding a signal by using the multi-edge LDPC code matrix, wherein the single parity check code matrix includes a first matrix having a non-row-orthogonal structure matrix and a second matrix having a pure row-orthogonal structure, which are concatenated.

10 Claims, 17 Drawing Sheets

(56) References Cited

U.S. PATENT DOCUMENTS

| | | | |
|---|---|---|---|
| 2010/0023838 A1 | 1/2010 | Shen et al. | |
| 2011/0029835 A1 | 2/2011 | Li et al. | |
| 2011/0083052 A1 | 4/2011 | Lau et al. | |
| 2015/0236816 A1* | 8/2015 | Myung | H03M 13/2778 |
| | | | 714/776 |
| 2015/0341053 A1* | 11/2015 | Kim | H03M 13/1102 |
| | | | 714/776 |
| 2016/0043740 A1* | 2/2016 | Ikegaya | H03M 13/1165 |
| | | | 714/776 |
| 2016/0165274 A1 | 6/2016 | Moon et al. | |
| 2016/0344420 A1* | 11/2016 | Jeong | H03M 13/2906 |

FOREIGN PATENT DOCUMENTS

| | | |
|---|---|---|
| CN | 104168029 | 11/2014 |
| CN | 106165303 | 11/2016 |
| CN | 109586843 | 4/2019 |
| EP | 2091171 | 8/2009 |
| EP | 3567731 | 11/2019 |
| KR | 1020060061145 | 6/2006 |
| KR | 1020150049775 | 5/2015 |
| WO | WO2018103638 | 6/2018 |

OTHER PUBLICATIONS

Catt, "Optimization on adjacent offsets of QC-LDPC codes," 3GPP TSG RAN WG1 AH_NR Meeting, dated Jan. 16-20, 2017, 4 pages.

EP Extended European Search Report in European Appln. No. 18747748.4, dated May 27, 2020, 17 pages.

Huawei, HiSilicon, "LDPC design for eMBB data," R1-1700092, 3GPP TSG RAN WG1 NR Ad-Hoc Meeting, Spokane, USA, dated Jan. 16-20, 2017, 17 pages.

Huawei, HiSilicon, "LDPC design for base graph 2," R1-1711437, 3GPP TSG RAN WG1 Meeting AH#2, Qingdao, P.R. China, dated Jun. 27-30, 2017, 4 pages.

JP Office Action in Japanese Appln. No. 2019-519698, dated Dec. 1, 2020, 7 pages (with English translation).

JP Office Action in Japanese Appln. No. 2019-519698, dated Mar. 31, 2020, 7 pages (with English translation).

KR Notice of Allowance in Korean Appln. No. 10-2018-7032458, dated May 30, 2019, 3 pages (with English translation).

LG Electronics, "LDPC Codes Design for eMBB data channel," 3GPP TSG RAN WG1 NR ad-hoc, dated Jan. 16-20, 2017, 7 pages.

LG Electronics, "LDPC Codes Design for eMBB data channel," R1-1700518, 3GPP TSG RAN WG1 NR ad-hoc, Spokane, USA, dated Jan. 16-20, 2017, 6 pages, XP051202940.

MediaTek et al., "Way Forward on LDPC Comparisons," R1-1701469, 3GPP TSG-RAN WG1 NR AH, Spokane, USA, dated Jan. 16-20, 2017, 5 pages.

MediaTek Inc., "High Efficiency LDPC code Features," R1-1701211, 3GPP TSG-RAN WG1 NR, Spokane, Washington, dated Jan. 16-20, 2017, 13 pages.

MediaTek Inc., "High Performance LDPC code Features," R1-1701210, 3GPP TSG-RAN WG1 NR, Spokane, Washington, dated Jan. 16-20, 2017, 17 pages.

MediaTek Inc., "Multi-codebook embedded compact QC-LDPC designs," R1-1706175, 3GPP TSG-RAN WG1 NR, Spokane, USA, dated Apr. 3-7, 2017, 14 pages, XP051252463.

Nokia, Alcatel-Lucent Shanghai Bell, "LDPC design for eMBB," R1-1609584, 3GPP TSG-RAN WG1 #86bis, Lisbon, Portugal, dated Oct. 10-12, 2016, 12 pages.

PCT International Search Report in International Appln. No. PCT/KR2018/001505, dated Jun. 5, 2018, 10 pages (with English translation).

Samsung, "Discussion on LDPC Code Design," 3GPP TSG RAN WG1 NR Ad-Hoc Meeting, dated Jan. 16-20, 2017, 13 pages.

Samsung, "Design of LDPC code for high throughput," R1-164813, 3GPP TSG RAN WG1 #85, Nanjing, China, dated May 23-27, 2016, 3 pages.

Shin et al., "Quasi-cyclic LDPC codes using overlapping matrices and their layered decoders," International Journal of Electronics and Communications (AEU), dated May 2014, vol. 68, No. 5, 5 pages.

ZTE, ZTE Microelectronics, "Compact LDPC design for eMBB," R1-1700247 3GPP TSG RAN WG1 AH NR Meeting, Spokane, USA dated Jan. 16-20, 2017, 16 pages.

ZTE, ZTE Microelectronics, "Compact LDPC design tor eMBB," R1-1701473, 3GPP TSG RAN WG1 AH NR Meeting, Spokane, USA, dated Jan. 16-20, 2017, 19 pages, XP051222469.

Office Action in Brazilian Appln. No. BR112019012715-1, dated May 10, 2022, 15 pages (with English translation).

Chen et al., "Design and Implementation of Adaptive Low-Density Parity-Check (LDPC) Code Decoder," Dissertation for the Degree of Master of Engineering, University of Electronic Science and Technology of China, School of Communication & Information Engineering, Feb. 15, 2016, 100 pages (with English Abstract).

Notification on the Grant of Patent in Chinese Appln. No. 201880002810.7, dated Nov. 3, 2022, 8 pages (with English translation).

* cited by examiner

FIG. 7

$$H = \begin{bmatrix} P^{h^b_{00}} & P^{h^b_{01}} & P^{h^b_{02}} & \cdots & P^{h^b_{0n_b}} \\ P^{h^b_{10}} & P^{h^b_{11}} & P^{h^b_{12}} & \cdots & P^{h^b_{1n_b}} \\ \cdots & \cdots & \cdots & \cdots & \cdots \\ P^{h^b_{m_b0}} & P^{h^b_{m_b1}} & P^{h^b_{m_b2}} & \cdots & P^{h^b_{m_bn_b}} \end{bmatrix} = P^{H^b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

METHOD FOR TRANSMITTING LDPC CODE USING ROW-ORTHOGONAL AND APPARATUS THEREFOR

CROSS-REFERENCE TO RELATED APPLICATIONS

This application is a continuation of U.S. application Ser. No. 16/065,542, filed on Aug. 9, 2018, which is a National Stage application under 35 U.S.C. § 371 of International Application No. PCT/KR2018/001505, filed on Feb. 5, 2018, which claims the benefit of U.S. Provisional Application No. 62/518,609, filed on Jun. 13, 2017, and U.S. Provisional Application No. 62/455,478, filed on Feb. 6, 2017. The disclosures of the prior applications are incorporated by reference in their entirety.

TECHNICAL FIELD

The present invention relates to a wireless local area network (LAN) system and, more particularly, to a method of transmitting a low-density parity-check (LDPC) code using a row-orthogonal structure in a system supporting the LDPC code and an apparatus supporting the same.

BACKGROUND

A wireless access system has been widely deployed to provide a diverse range of communication services such as a voice communication service and a data communication service. Generally, the wireless access system is a multiple access system capable of supporting communication with multiple users by sharing available system resources (e.g., bandwidth, transmit power, etc.). For example, the multiple access system may include one of a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, a multi-carrier frequency division multiple access (MC-FDMA) system, and the like.

In a broadcast system as well as in the above-described communication system, a channel code is necessarily used. As an example of a general configuration method of the channel code, a transmitter may encode an input symbol using an encoder and transmit the encoded symbol. A receiver, for example, may receive the encoded symbol and decode the received symbol, thereby recovering the input symbol. In this case, the size of the input symbol and the size of the encoded symbol may be differently defined according to a communication system. For example, in a turbo code for data information used in a 3rd generation partnership project (3GPP) long term evolution (LTE) communication system, the size of the input symbol is a maximum of 6144 bits and the size of the encoded symbol is 18432 (6144*3) bits. For turbo coding of the LTE communication system, reference is made to 3GPP technical specification 36.212.

However, even when a signal-to-noise ratio (SNR) increases, the LTE turbo code is characterized in that performance improvement is not remarkable out of a predetermined region due to the structure of the code. Regarding this problem, although use of a code having a low error rate may be considered, complexity increases.

In a communication system, a high error rate may require unnecessary retransmission of data and cause failure in channel reception. In addition, a code having excessively high complexity may increase overhead of a base station (BS) and a user equipment (UE) and cause transmission and reception latency. Especially, in a future-generation communication system requiring faster data transmission and reception, the above-described problems need to be solved. Therefore, a coding method having low complexity while lowering an error rate is demanded.

Especially, with regard to 5th generation (5G) mobile communication technology, ultra-reliable and low-latency communication (URLLC) is under discussion. A URLLC scenario demands that error floor occur at a block error rate (BLER) of $10^{-5}$ or less. Herein, the error floor means a point at which reduction in error rate is slight although the size of information increases. In the LTE turbo code, the error floor occurs at a BLER of $10^{-4}$ or less as the size of information increases. Accordingly, an LDPC code may be used as an alternate of the turbo code. The LDPC code may achieve a low error rate with relatively low complexity. For efficient use of the LDPC code, a method of selecting a base code from multiple LDPC codes needs to be determined.

SUMMARY

It is a technical object of the present invention to provide a method of transmitting an LDPC code suitable for a given communication environment in a wireless LAN system using LDPC codes.

Another technical object of the present invention is to provide a method of generating a row-orthogonal LDPC code structure capable of being use in a wireless LAN system using multiple LDPC codes.

The present invention is not limited to what has been particularly described hereinabove and other technical objects can be derived from embodiments of the present invention.

In accordance with an aspect of the present invention, the above and other objects can be accomplished by the provision of a method of encoding with a quasi-cyclic low-density parity-check (LDPC) code. The method comprises generating a multi-edge LDPC code matrix including a high rate code matrix and a single parity check code matrix; and encoding a signal using the multi-edge LDPC code matrix, wherein the single parity check code matrix is formed by concatenating a first matrix configured with a non-row-orthogonal structure matrix and a second matrix configured with a pure row-orthogonal structure.

In accordance with another aspect of the present invention, there is provided an apparatus for encoding with a quasi-cyclic low-density parity-check (LDPC) code. The apparatus comprises a transceiver and a processor. The processor is configured to generate a multi-edge LDPC code matrix including a high rate code matrix and a single parity check code matrix and encode a signal using the multi-edge LDPC code matrix, and wherein the single parity check code matrix is formed by concatenating a first matrix configured with a non-row-orthogonal structure matrix and a second matrix configured with a pure row-orthogonal structure.

The following may be commonly applied to the above method and apparatus for encoding the LDPC code.

The first matrix may include edges having the same column value with respect to consecutive rows, and the second matrix may not include the edges having the same column value with respect to consecutive rows.

The first matrix may include a first number of rows and the second matrix includes a second number of rows. The first number and the second number may be determined based on a total number of rows of the single parity check code matrix and a minimum code rate of the multi-edge LDPC code.

The first number may be determined by a product of the total number of rows of the single parity check code and the minimum code rate, and the second number may be determined by subtracting the first number from the total number of rows of the single parity check code matrix.

The first matrix may include a first number of rows and the second matrix may include a second number of rows. The first number and the second number may be determined to allocate the second matrix to rows starting from a row of the single parity check code matrix having a preset code rate.

The first matrix may be configured with 22 rows and the second matrix may be configured with 20 rows.

The high rate code matrix may be configured with a 7×17 matrix structure and the high rate code matrix may include a dual-diagonal parity matrix of a 4×4 structure.

According to an embodiment of the present invention, an LDPC code can be generated using LDPC codes suitable for various communication environments.

According to another embodiment of the present invention, an LDPC code can be transmitted without performance degradation of a system, using a partial row-orthogonal LDPC code structure.

Other technical effects in addition to the above-described technical effects can be derived from embodiments of the present invention.

BRIEF DESCRIPTION OF THE DRAWINGS

FIG. 7 is a diagram illustrating an exemplary structured parity check matrix.

FIG. 8 is a diagram illustrating an exemplary model matrix.

DETAILED DESCRIPTION

Reference will now be made in detail to the exemplary embodiments of the present invention, examples of which are illustrated in the accompanying drawings. The detailed description set forth below in connection with the appended drawings is intended as a description of exemplary embodiments and is not intended to represent the only embodiments through which the concepts explained in these embodiments can be practiced.

The detailed description includes details for the purpose of providing an understanding of the present invention. However, it will be apparent to those skilled in the art that these teachings may be implemented and practiced without these specific details. In some instances, well-known structures and devices are omitted in order to avoid obscuring the concepts of the present invention and the important functions of the structures and devices are shown in block diagram form.

The following technology may be applied to a variety of wireless access systems using code division multiple access (CDMA), frequency division multiple access (FDMA), time division multiple access (TDMA), orthogonal frequency division multiple access (OFDMA), single carrier frequency division multiple access (SC-FDMA), and the like. CDMA may be embodied through radio technology such as universal terrestrial radio access (UTRA) or CDMA2000. TDMA may be embodied through radio technology such as global system for mobile communications (GSM)/general packet radio service (GPRS)/enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802-20, and evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in downlink and SC-FDMA in uplink. LTE-advanced (LTE-A) is an evolved version of 3GPP LTE.

For clarity of description, the following description focuses on the 3GPP LTE/LTE-A system. However, the technical features of the present invention are not limited thereto. Specific terms used in the following description are provided to aid in understanding the present invention. These specific terms may be replaced with other terms within the scope and spirit of the present invention.

Figure 1:
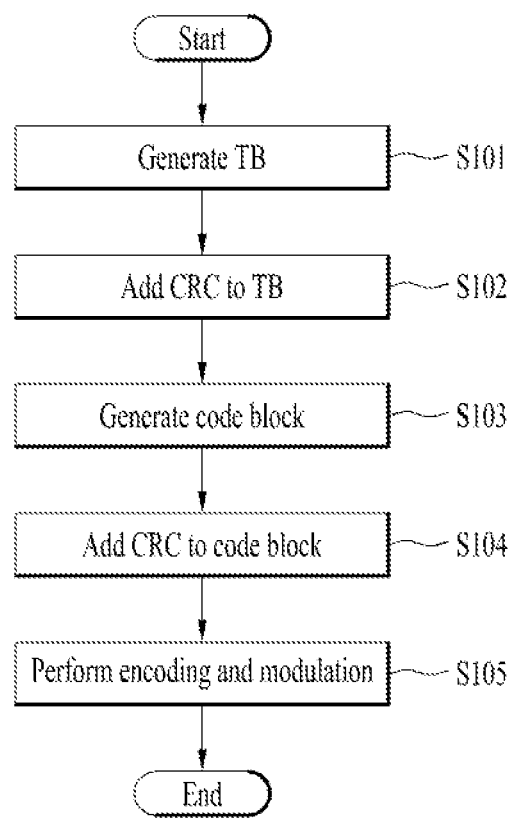
FIG. 1 is a flowchart illustrating an exemplary encoding procedure.

FIG. 1 is a flowchart illustrating an exemplary encoding procedure.

The encoding procedure as illustrated in FIG. 1 may be applied to numerous channel codes including a turbo code used in the LTE communication system. Hereinafter, for convenience of description, the encoding procedure will be described based on terms according to the standard specifications of the LTE communication system.

In the example of FIG. 1, a transmitter may generate a transport block (TB) (step S101). The transmitter adds a cyclic redundancy check (CRC) bit for the TB to the TB (step S102). The transmitter may generate code blocks from the TB to which the CRC bits are added (step S103). For example, the transmitter may segment the TB into the code blocks based on an input size of an encoder. The transmitter may add the CRC bits to each of the segmented code blocks (step S104). In this case, the size of the code block and the code block CRC bits may be 6144 bits. The transmitter may perform encoding and modulation with respect to each block which consists of a code block and code block CRC bits (step S105). For example, turbo coding may be applied as described previously.

A decoding procedure may be performed in a reverse order of the encoding procedure of FIG. 1. For example, a receiver may decode each code block using a decoder corresponding to each encoder, configure one final TB, and perform CRC confirmation for the TB.

For example, the size of an input symbol may be different from the size of a TB from a media access control (MAC) layer. If the size of the TB is greater than a maximum size of the input symbol of the turbo code, the TB may be segmented into a plurality of code blocks (CBs). According to standard of the LTE communication system, the size of the CB may be equal to a value obtained by subtracting the CRC bits from 6144 bits. The input symbol of the turbo code may be defined as data including a CB and a CRC or data including a TB (e.g., the size of the TB is less than 6144 bits) and a CRC. The CRC bits are significantly less than 6144 bits (e.g., the CRC bits are a maximum of 24 bits). Therefore, in the following description, a CB may refer to a CB itself or a CB and corresponding CRC bits and a TB may refer to a TB itself or a TB and corresponding CRC bits, unless defined otherwise).

Figure 2:
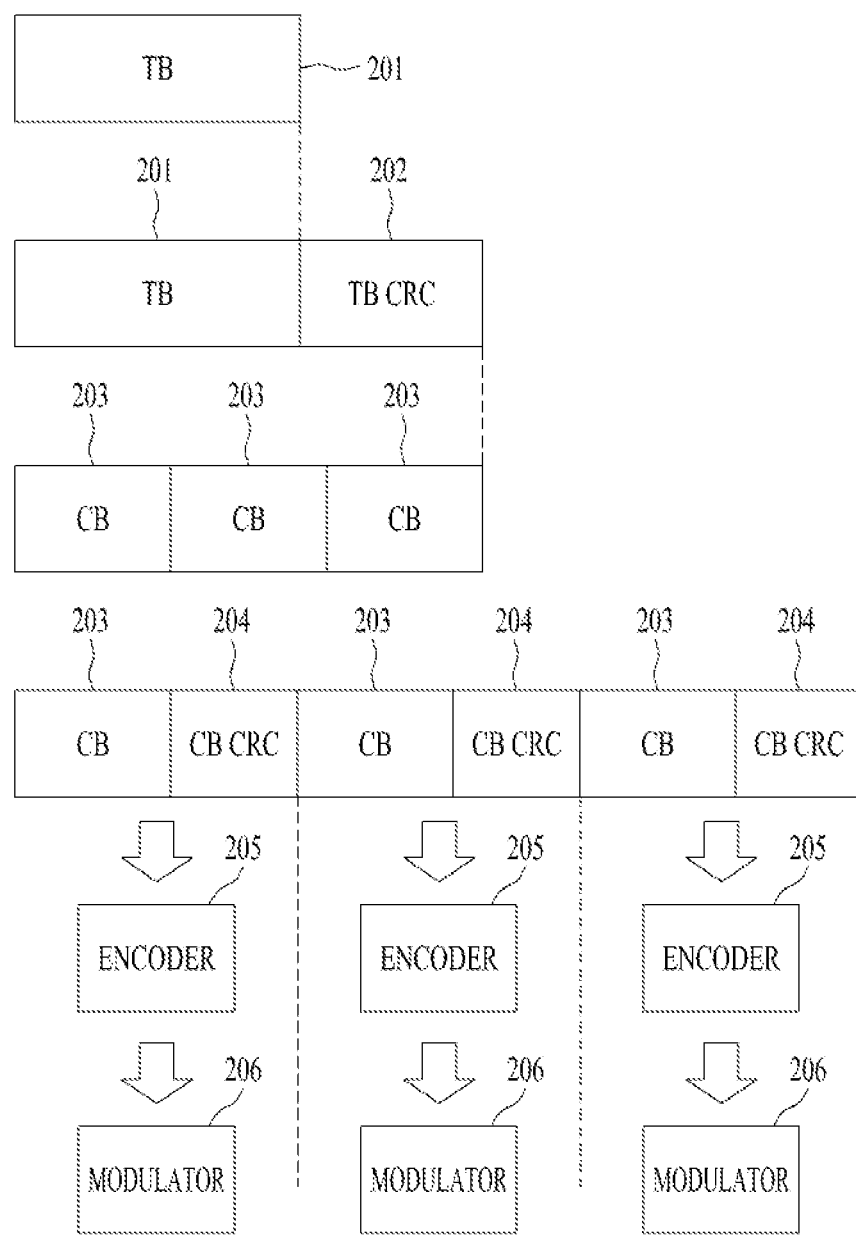
FIG. 2 is a diagram illustrating an exemplary transport block (TB) encoding procedure.

FIG. 2 is a diagram illustrating an exemplary TB encoding procedure.

FIG. 2 illustrates an encoding procedure of a TB 201 corresponding to the above-described encoding procedure in relation to FIG. 1. First, a TB CRC 202 is added to the TB 201. The TB CRC 202 may be used to confirm the TB 201 during a decoding procedure. Next, the TB 201 and the TB CRC 202 are divided into three CBs 203. In this embodiment, while the TB 201 and the TB CRC 202 are divided into the three CBs 203, the TB 201 may be divided into a plurality of CBs based on the input size of an encoder 205.

CB CRCs 204 are added to the respective CBs 203. The CB CRCs 204 may be used to confirm the CBs 203 by the receiver. The CBs 203 and the CB CRCs 204 may be encoded through respective encoders 205 and respective modulators 206.

Figure 3:
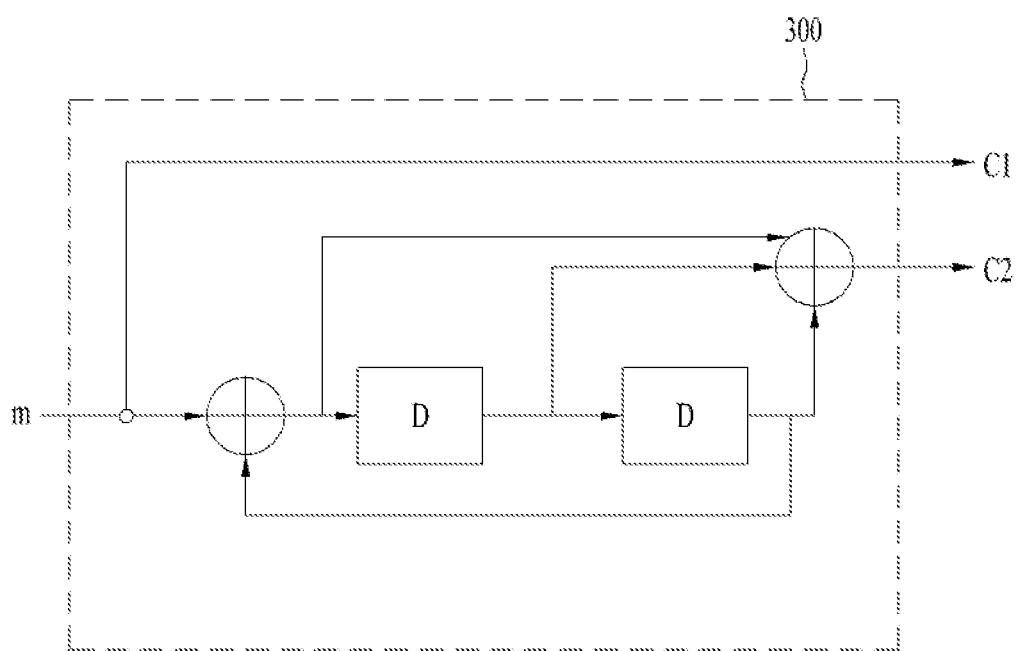
FIG. 3 is a diagram illustrating an exemplary recursive systematic convolutional (RSC) encoder.

FIG. 3 is a diagram illustrating an exemplary recursive systematic convolutional (RSC) encoder.

An RSC encoder 300 of FIG. 3 may be used for turbo coding. In FIG. 3, m denotes input data, C1 denotes a systematic bit stream, and C2 denotes a coded bit stream. Herein, the RSC encoder 300 has a code rate of 1/2.

The RSC encoder 300 may be configured by feeding back an encoded output to an input of a non-recursive, non-systematic convolutional encoder. In the embodiment of FIG. 3, the encoder 300 includes two delayers 301 and 302. A value D of each of the delayers 301 and 302 may be determined according to a coding scheme. The delayers 301 and 302 may be configured by memories or shift registers.

Figure 4:
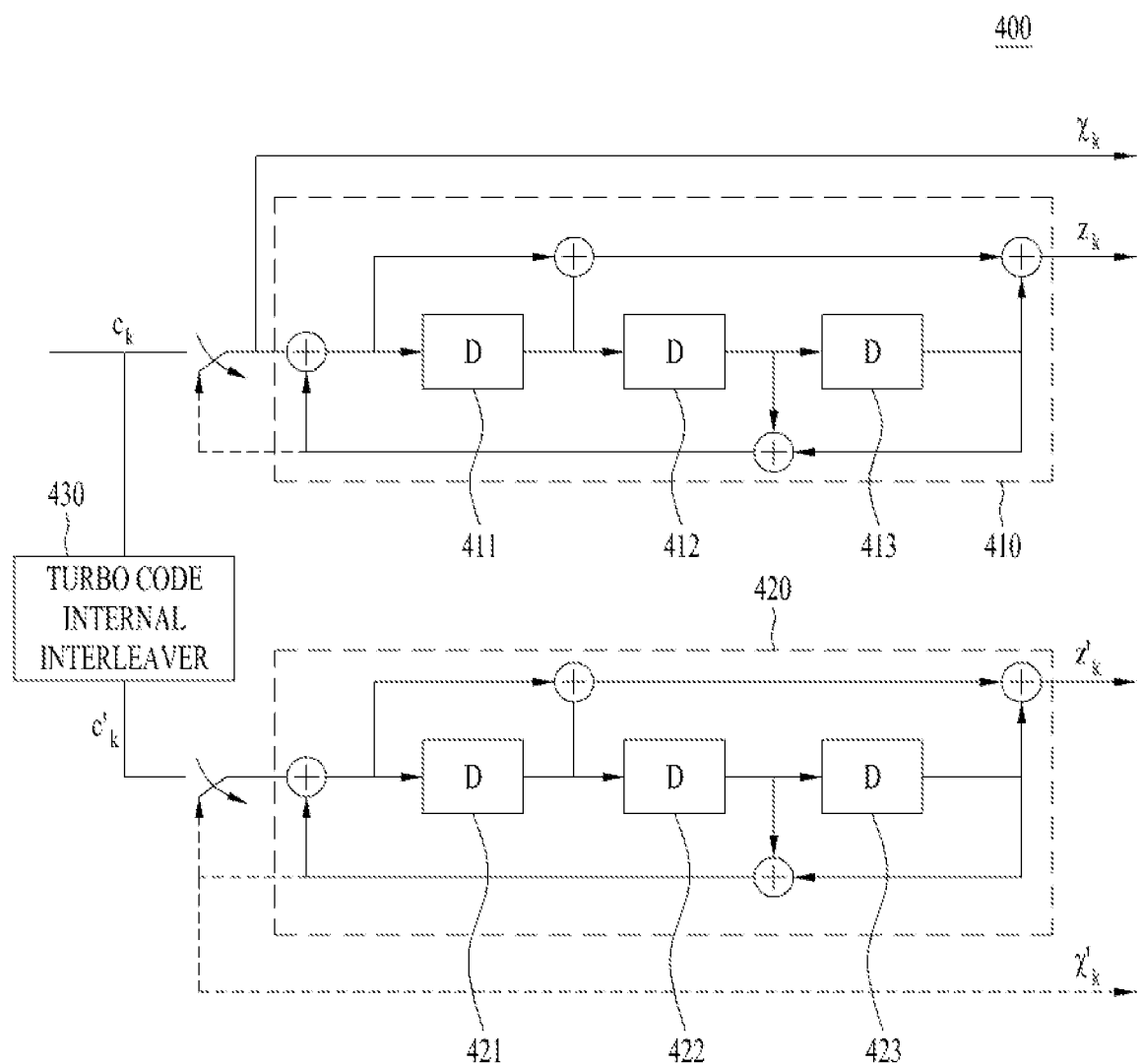
FIG. 4 is a diagram illustrating an LTE turbo encoder.

FIG. 4 is a diagram illustrating an LTE turbo encoder.

A coding scheme of an LTE turbo encoder 400 uses a parallel concatenated convolutional code (PCCC) implemented through two 8-state constituent encoders 410 and 420 and one turbo code internal interleaver 430.

In FIG. 4, the turbo encoder 400 includes the first constituent encoder 410, the second constituent encoder 420, and the turbo code internal interleaver 430. The first constituent encoder 410 and the second constituent encoder 420 are 8-state constituent encoders. Each of the first constituent encoder 410 and the second constituent encoder 420 has a structure similar to the RSC encoder of FIG. 3. The first constituent encoder 410 and the second constituent encoder 420 include three delayers 411, 412, and 413 and three delayers 421, 422, 423, respectively.

In FIG. 4, D denotes a value determined based on a coding scheme. $c_k$ denotes an input to the turbo encoder 400. Outputs from the first constituent encoder 410 and the second constituent encoder 420 are denoted as $z_k$ and $z'_k$, respectively. An output from the turbo code internal interleaver 430 is denoted as $c'_k$. Generally, each of the delayers 411, 412, 413, 421, 422, and 423 may delay an input value by one clock. However, each of the delayers 411, 412, 413, 421, 422, and 423 may be configured to delay the input value by more than one clock according to internal configuration. Each of the delayers 411, 412, 413, 421, 422, and 423 may be comprised of a shift register and may be configured so as to delay an input bit by a preset clock and then output the input bit therethrough.

The turbo code internal interleaver 430 may reduce an effect of a burst error which may be generated during signal transmission on a radio channel. For example, the turbo code internal interleaver 430 may be a quadratic polynomial permutation (QPP) interleaver.

A turbo code is a high-performance forward error correction (FEC) code used in the LTE communication system. For example, a data block coded by the turbo code may include three subblocks. One subblock may correspond to m-bit payload data. Another subblock may include n/2 parity bits for a payload, calculated using an RSC code. In addition, the other subblock may include n/2 parity bits for permutation of payload data, calculated using the RSC code. For example, the above permutation may be performed by the interleaver. Accordingly, the two different subblocks of parity bits may constitute one block together with the subblock for the payload. As an example, when m is equal to n/2, one block has a code rate of 1/3.

In the first constituent encoder 410, a procedure in which the input $c_k$ reaches the encoded bit $z_k$ may be divided into two paths. The two paths include a first path connected to an output stage from an input stage without feedback and a second path fed back from the input stage back to the input stage.

On the first path, the input $c_k$, the input $c_k$ passing through the delayer 411, and the input $c_k$ passing through the delayers 411, 412, and 413 are supplied to the output stage. A relationship between the input stage and the output stage for the first path may be expressed as a polynomial. The polynomial for the first path is referred to as a forward generator polynomial and may be expressed as g1 of the following equation indicated below.

$$g1(D) = 1D + D^3 \qquad \text{Equation 1}$$

Meanwhile, on the second path, the input $c_k$, the input $c_k$ passing through the delayers 411 and 142, and the input $c_k$ passing through the delayers 411, 412, and 413 are fed back to the input stage. A polynomial for the second path is referred to as a recursive generator polynomial and may be expressed as g0 of the following equation indicated below.

$$g0(D) + D^2 + D^3 \qquad \text{Equation 2}$$

In Equations 1 and 2, "+" denotes exclusive OR (XOR) and 1 represents that an input is subjected to delay zero times. In addition, $D^n$ represents that an input is subjected to delay n times.

Figure 5:
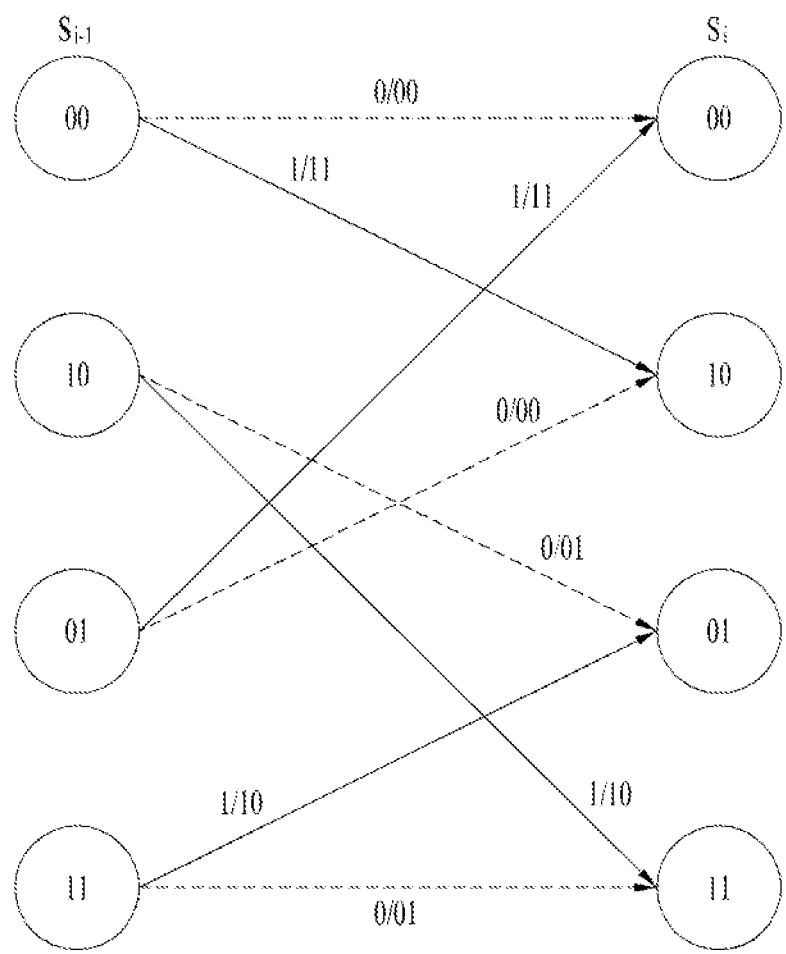
FIG. 5 is a diagram illustrating an exemplary trellis according to an RSC encoder.

FIG. 5 is a diagram illustrating an exemplary trellis according to an RSC encoder.

FIG. 5 illustrates the structure of the trellis of the RSC encoder of FIG. 3. In FIG. 5, $S_i$ denotes a state of i-th input data. In FIG. 5, each circle denotes a node. A line between nodes denotes a branch. A branch of a real line means a branch for an input value 1 and a branch of a dotted line means a branch for an input value 0. A value on the branch is expressed as m/C1C2 (input value/systematic bit, encoded bit). The trellis may have states exponentially proportional to the number of memories of the encoder. For example, if the encoder includes a memories, $2^a$ states may be included in the trellis.

The trellis is a state machine illustrating state transition of an encoder allowable two states. A convolutional encoder such as the RSC encoder may perform encoding according to a trellis diagram. A codeword encoded by the RSC encoder may be decoded according to an algorithm based on a trellis structure. For example, a Viterbi or Bahl, Cocke, Jelinek and Raviv (BCJR) algorithm may be used.

Figure 6:
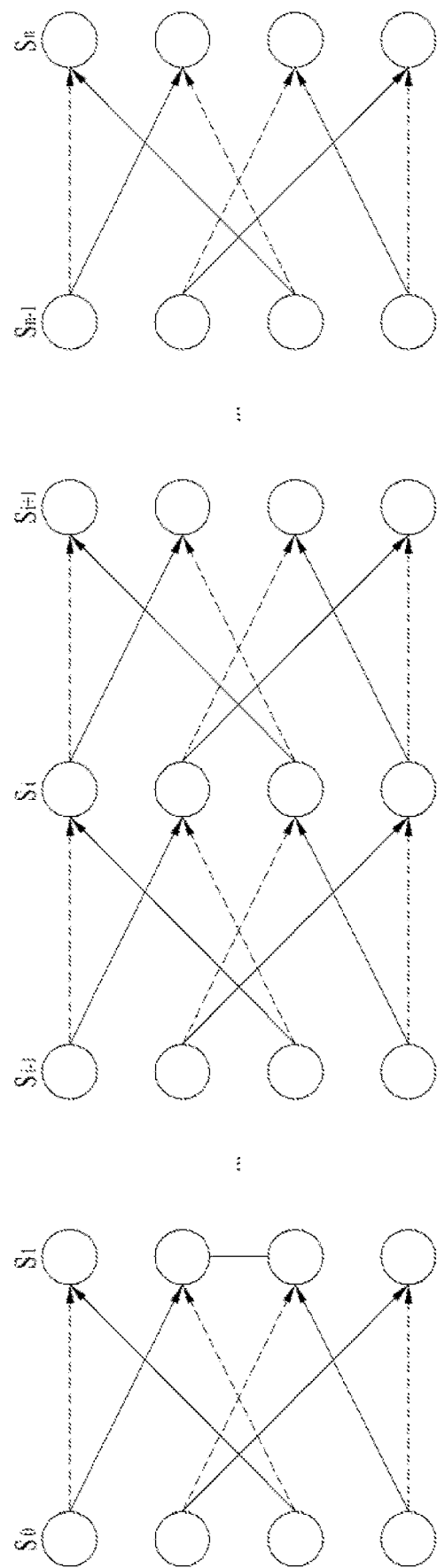
FIG. 6 is a diagram illustrating an exemplary trellis structure.

FIG. 6 is a diagram illustrating an exemplary trellis structure.

In FIG. 6, n denotes the length of a codeword. Typically, additional bits are added to the end of an input sequence, thereby terminating a trellis. Generally, a sequence consisting of 0s is referred to as tail bits. The tail bits terminate the trellis by causing nodes of one state of the trellis to have a value of 0.

In FIG. 6, the length of the codeword may be determined in consideration of the length k of input data and the length t of tail bits. For example, when a code rate is R, the length n of the codeword may have a value of (k+t)/R. Generally, the length t of the tail bits may be determined as a length with which all delays (e.g., memories) of an encoder can be reset. As an example, the RSC encoder of FIG. 3 may use a total of two tail bits. In addition, the turbo encoder of LTE communication as illustrated in FIG. 4 may use three tail bits.

The tail bits have a relatively short length as compared with the length of input data. As described above, since the length of the codeword is associated with the length of the tail bits, if the length of the codeword is limited, code rate loss may occur due to the tail bits. However, although code rate loss is generated due to the tail bits, trellis termination using the tail bits is widely used because of low complexity of calculation and excellent error correction performance.

Puncturing is a scheme of puncturing a part of codewords. Through puncturing, since a part of codewords is punctured, partial codewords are not transmitted. For example, puncturing may be used to reduce code rate loss caused by addition of the tail bits. In this case, a receiver may perform decoding using a trellis corresponding to the sum of the length k of the input data and the length t of the tail bits. That is, the receiver may perform decoding under the assumption that the receiver has received codewords which are not punctured. In this case, the receiver may regard a branch from a node corresponding to a punctured bit (i.e., a bit which is not transmitted by a transmitter) as having no input value. That is, it is assumed that the input data for branches of a corresponding node is 0 or 1 with the same possibility.

As described above in relation to FIG. 1, a CRC for a CB is added to the CB. The CRC may be determined as a remainder derived after data to be transmitted is divided by a preset check value used as a divisor. Generally, the CRC may be added to the end of the transmission data. The receiver may compare the remainder after reception data is divided by the preset check value with the CRC or determine whether a remainder after entire reception data including the CRC is divided by the check value is 0.

If the size of a TB is 6144 bits, the size of the CRC may be a maximum of 24 bits. Accordingly, the other bits except for the CRC bits may be determined as the size of the CB.

The receiver may perform decoding with respect to each CB. Thereafter, the receiver may configure the TB from CBs and determine whether decoding has been successfully performed by checking the CRC for the TB. In a current LTE system, a CB CRC is used for early decoding termination. For example, if a CRC for one CB fails, the receiver may not decode the other CBs and transmit a negative acknowledgement (NACK) to the transmitter.

Upon receiving NACK, the transmitter may retransmit at least a part of transmission data. For example, the transmitter may retransmit a TB or one or more CBs. As an example, when the transmitter retransmits all of the TB, radio resources for retransmission may be excessively consumed. In addition, for example, when the receiver generates NACK due to failure of a CB CRC, the receiver may transmit information about a CB (e.g., an index of a CB) in which CRC failure has occurred to the transmitter. The transmitter may increase the efficiency of radio resources by transmitting only the CB in which CRC failure has occurred using the information about the CB. However, if the number of CBs increases, the amount of data for feeding back the information about the CBs (e.g., indexes of the CBs) increases.

In the LTE communication system, the receiver may inform the transmitter through an ACK/NACK signal whether data has been successfully received. In the case of frequency division duplex (FDD), ACK/NACK for data received in an i-th subframe is transmitted in an (i+4)-th subframe. If NACK is received in the (i+4)-th subframe, retransmission may be performed in an (i+8)-th subframe. This is to consider a time for processing the TB and a time for generating ACK/NACK because channel code processing for processing the TB consumes much time. In the case of time division duplex (TDD), ACK/NACK and retransmission subframes may be determined based on a time for processing the TB, a time for generating ACK/NACK, and uplink subframe allocation (e.g., TDD uplink/downlink configuration). In addition, ACK/NACK bundling and multiplexing may be used.

As described above, the turbo code shows restricted improvement in an error rate if an SNR exceeds a predetermined value. As an alternative to the turbo code, a low-density parity-check (LDPC) code has been proposed. The LDPC code is a linear block code and is used in IEEE 802.11n and 802.11ac and digital video broadcasting (DVB). The LDPC code may include a generation matrix and a parity check matrix. In the LDPC code, data may be encoded through a multiplication operation of message bits and the generation matrix. Generally, in communication specification using the LDPC code, the parity check matrix may be used instead of the generation matrix. For example, data may be encoded using the parity check matrix.

The linear block code may be generated based on a generation matrix G or a parity check matrix H. The linear block code is configured such that the product $Hc^t$ of a transpose matrix of a codeword c and the parity check matrix has a value of 0 with respect to the whole codeword c. Decoding of the LDPC code may be performed, as identical to other linear block codes, by checking whether the product of the parity check matrix H and the codeword c is '0'. For example, decoding of the LDPC code may be performed by checking whether the product (i.e., $Hc^t$) of a transpose matrix of the codeword c and the parity check matrix is 0.

In the LDPC code, most elements of the parity check matrix are 0 and there are a small number of elements having values other than 0 as compared with the length of the code. Therefore, the LDPC code may perform iterative decoding based on probability. In an initially proposed LDPC code, the parity check matrix has been defined in a non-systematic form and a small weight has been uniformly applied to rows and columns of the parity check matrix. A weight may mean the number of 1s included in a row or a column.

As described above, the density of elements having values other than 0 in a parity check matrix H of the LDPC code is low. Accordingly, the LDPC code has performance approximating to limits of Shannon's theorem while decoding complexity is kept low. Due to high error correction performance and low decoding complexity of this LDPC code, the LDPC code is suitable for high-speed wireless communication.

Structured LDPC Code

As described previously, the parity check matrix H may be used to generate the LDPC code. The matrix H includes a large number of 0s and a small number of 1s. The size of the matrix H may be $10^5$ bits or more. Many memories may be needed to express the H matrix.

Figures 7, 8:
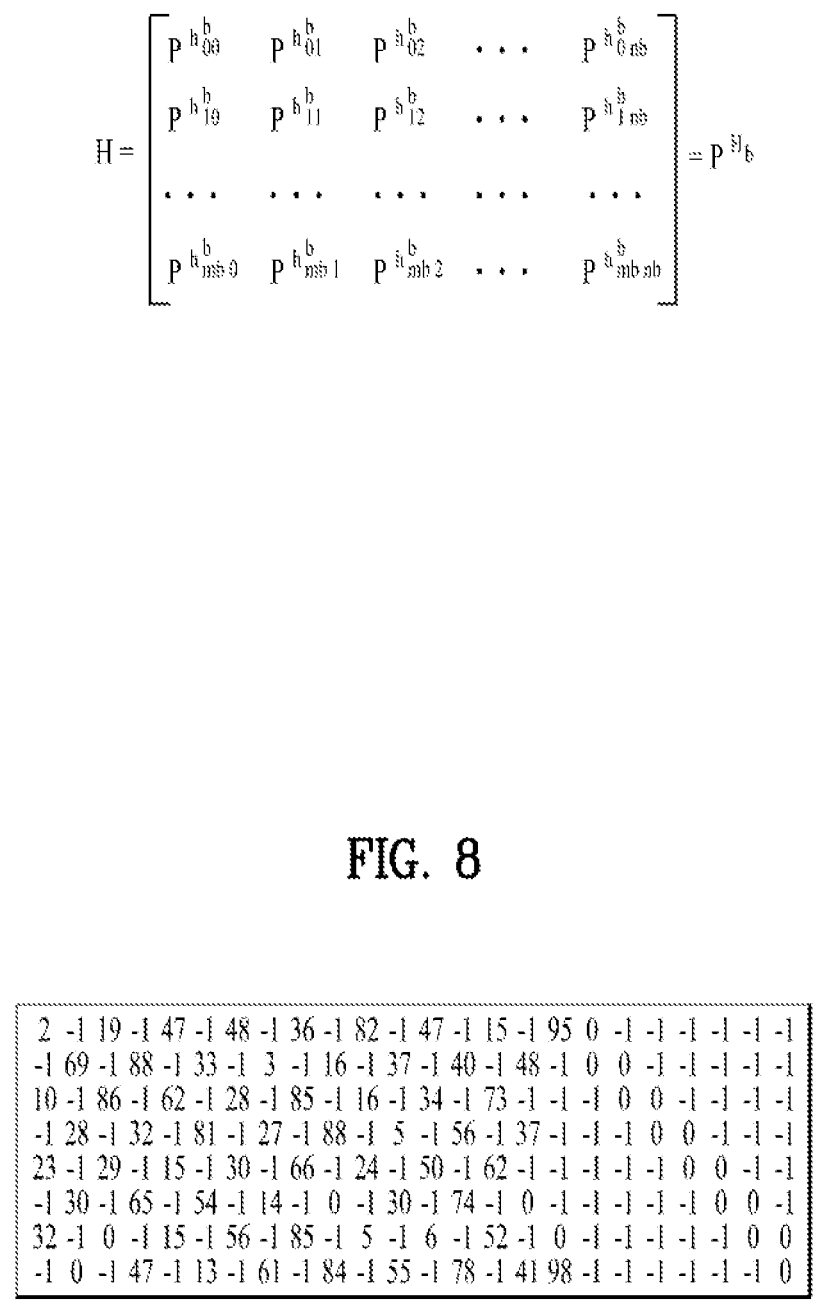

FIG. 7 is a diagram illustrating an exemplary structured parity check matrix.

In the structured LDPC code, elements of the matrix H may be expressed as subblocks of a predetermined size as illustrated in FIG. 7. In FIG. 7, each of the elements of the matrix H represents one subblock.

In the IEEE 802.16e standard specification, a subblock is indicated by one integer index, so that the size of memories for expressing the matrix H may be reduced. Each subblock may be, for example, a permutation matrix of a predetermined size.

FIG. 8 is a diagram illustrating an exemplary model matrix.

For example, referring to the IEEE 802.16e standard specification, if the size of codewords is 2304 and a code rate 2/3, a model matrix used to encode/decode the LDPC code is as illustrated in FIG. 8. The model matrix may mean a parity check matrix including at least one subblock described below. The subblock may be referred to as the number of shifts in the following description. The model matrix may be extended to the parity check matrix based on a method which will be described later. Therefore, encoding and decoding based on a specific model matrix means encoding and decoding based on a parity check matrix generated by extending the model matrix.

In FIG. 8, index '−1' indicates a zero matrix of a preset size. Index '0' indicates an identity matrix of a preset size. A positive index except for '−1' and '0' indicates the number of shifts. For example, a subblock expressed as index '1' may mean a matrix obtained by shifting an identity matrix once in a specific direction.

Figures 9, 10:
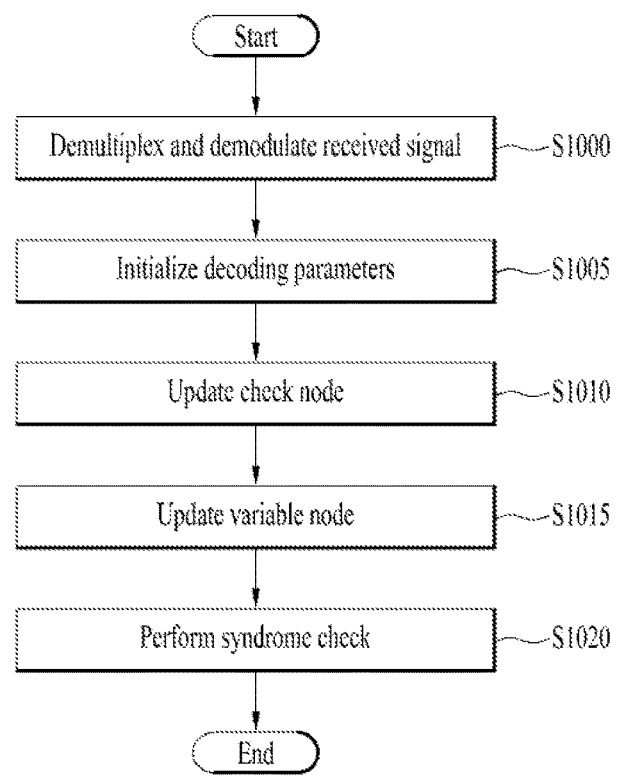
FIG. 9 is a diagram referenced to explain matrix transformation according to the number of shifts.
FIG. 10 is a flowchart illustrating an exemplary LDPC code decoding method.

FIG. 9 is a diagram referenced to explain matrix transformation according to the number of shifts.

For example, FIG. 9 illustrates the case in which the size of a subblock is 4 rows and 4 columns. In FIG. 9, the subblock is shifted from an identity matrix three times to the right. In this case, in a parity check matrix of a structured LDPC code, the subblock may be represented using an integer index of '3'.

Generally, encoding of the LDPC code may be performed by generating a generation matrix G from a parity check matrix H and encoding information bits using the generation matrix. To generate the generation matrix G, Gaussian reduction is performed with respect to the parity check matrix H to configure a matrix in the form of $[P^T: I]$. If the number of the information bits is k and the size of encoded codewords is n, a matrix P is a matrix including k rows and n-k columns and a matrix I is an identity matrix having a size of k.

If the parity check matrix H has the form of $[P^T: I]$, the generation matrix G has a form of $[I: P^T]$. If k information bits are encoded, the encoded information bits may be expressed as a matrix x of one row and k columns. In this case, a codeword c is xG having a form of [x: xP]. Herein, x denotes an information part (or a systematic part) and xP denotes a parity part.

In addition, the information bits may be encoded directly from the matrix H without deriving the matrix G by designing the matrix H as a specific structure without using Gaussian reduction. For the structures of the above-described matrix H and matrix G, the product of the matrix G and a transpose matrix of the matrix H has a value of 0. Using such a characteristic and a relationship between the information bits and the codeword, the codeword may be obtained by adding parity bits to the end of the information bits.

FIG. 10 is a flowchart illustrating an exemplary LDPC code decoding method.

In a communication system, encoded data includes noise in a process of passing through a radio channel. Accordingly, a codeword c is expressed as a codeword c' including noise in a receiver. The receiver performs demultiplexing and demodulation with respect to a received signal (step S1000) and initializes decoding parameters (step S1005). The receiver updates a check node and a variable node (steps S1010 and S1015) and performs syndrome check (step S1020). That is, a decoding procedure may be ended by checking whether $c'H^T$ is 0. If $c'H^T$ is 0, the first k bits from c' may be determined as the information bits x. If $c'H^T$ is not 0, the information bit x may be recovered by searching for c' satisfying the condition that $c'H^T$ is 0 based on a decoding scheme such as a sum-product algorithm.

Figure 11:
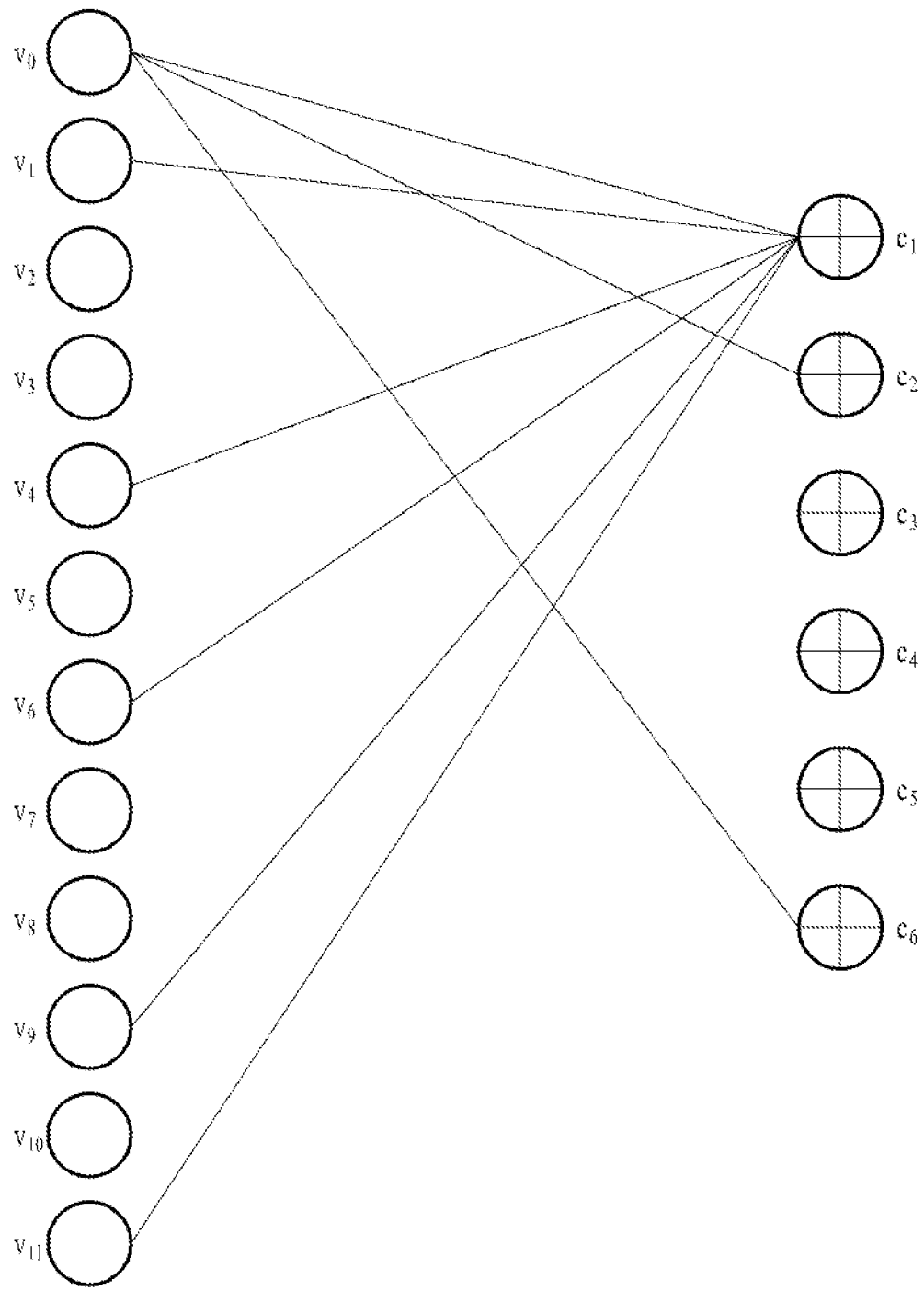
FIG. 11 is a diagram illustrating an exemplary bipartite graph.

FIG. 11 is a diagram illustrating an exemplary bipartite graph.

In FIG. 11, left nodes $v_0, v_1, \ldots, v_{11}$ represent variable nodes and right nodes $c_1, c_2, c_6$ represent check nodes. In the example of FIG. 11, a bipartite graph is illustrated focusing on the variable node $v_0$ and check node $c_1$ for convenience of description. Connection lines of the bipartite graph of FIG. 11 may be referred to as edges. The bipartite graph of FIG. 11 may be generated from $Hc^t$. Therefore, in FIG. 11, edges from the variable node $v_0$ correspond to the first column of the parity check matrix H and edges from the check node $c_1$ correspond to the first row of the matrix H.

As described above, in order to successfully perform decoding, the product of the parity check matrix H and a transpose matrix of the codeword matrix c should have a value of '0'. Accordingly, values of variable nodes connected to one check node should be 0. Consequently, in FIG. 11, values of exclusive OR (XOR) of the variable nodes $v_0, v_1, v_4, v_0, v_9, v_{11}$ connected to the check node $c_1$ should be '0'. Syndrome check means checking as to whether a value of XOR of variable nodes connected to each check node is 0.

Quasi-Cyclic (QC) LDPC Code

Hereinafter, a QC LDPC code will be described.

To acquire excellent performance of an LDPC code, a parity check matrix (or a generation matrix) may be randomly configured. The performance of the LDPC code may be improved as the length of a block increases. In decoding, the performance of the LDPC code may be improved through an optimal decoding method. However, due to complexity of optimal decoding, a belief propagation algorithm is used to decode the LDPC code. In addition, the randomly generated parity check matrix of the LDPC code has excellent performance but is very complicated in implementation and representation thereof. Hence, the above-described structured LDPC code is widely used. As the structured LDPC code, a QC LDPC code is widely used.

The QC LDPC code includes a zero matrix having a size of Q× Q and a circulant permutation matrix (CPM) having a size of Q×Q. The CPM $P^a$ has a form obtained by shifting an identity matrix having a size of Q×Q by a circular shift value a (refer to FIG. 9). For example, as illustrated in FIG. 7, the parity check matrix H may include (mb+1)×(nb+1) CPMs. As described previously, a circular shift value of 0 represents an identity matrix and a circular shift value of −1 represents a zero matrix. In addition, the parity check matrix may be expressed as a matrix of circular shift values as illustrated in FIG. 8. Herein, a value of each circular shift may be configured to a value equal to or greater than −1 and equal to or less than Q−1. The matrix configured by circular shift values as illustrated in FIG. 8 may be referred to as a circular shift matrix or a characteristic matrix.

Figure 12:
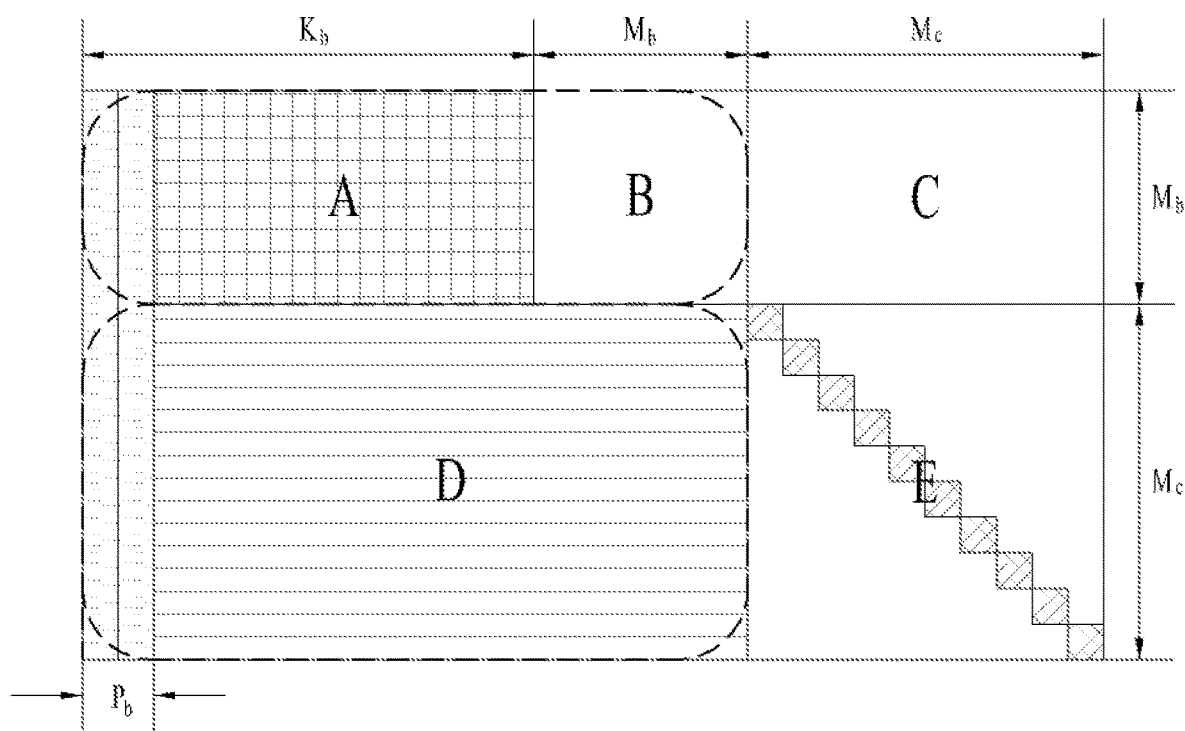
FIG. 12 is a diagram illustrating the structure of an LDPC code according to an embodiment of the present invention.

FIG. 12 is a diagram illustrating the structure of an LDPC code according to an embodiment of the present invention.

In the following embodiment, a multi-edge QC LDPC code may be used. For example, as illustrated in FIG. 12, the multi-edge QC LDPC code may have a structure in which a high rate code similar to QC irregular repeat accumulation (IRA) (QC-IRA) and a single parity check code are concatenated. For example, a parity check matrix H of the multi-edge QC LDPC code may be defined as follows.

$$H = \begin{bmatrix} A & B & C \\ D & E & \end{bmatrix} \quad \text{Equation 3}$$

In the above equation, A and B (Mb*(Kb+Mb)) denote high rate codes having structures similar to QC-IRA and C (Mb*Mc) denotes a zero matrix. In addition, D (Mc*(Kb+Mb)) and E (Mc*Mc) denote an information part of a single parity check code and a parity part of the single parity check code, respectively. In this case, E may be determined as a single-diagonal structure.

In FIG. 12, Kb denotes the size of information to be encoded. In addition, Mb denotes the size of a parity of a high rate code part and Mc denotes the size of a parity of a single parity check code part. Pb denotes a puncturing size applied to the LDPC code.

In this case, the size of Pb may be determined in consideration of a maximum number of iterations that an LDPC decoder can perform. In some embodiments of the present invention, the maximum number of iterations of the decoder may be 50 and then the size of Pb may be 2Z. However, the present invention is not limited to such a structure. In FIG. 12, a parity structure of the high rate code part A may be determined as a dual-diagonal structure in consideration of an encoding scheme.

For configuration of a QC LDPC code of a desired size, a lifting operation may be performed. Lifting is used to acquire a parity check matrix of a desired size from a preset parity check matrix. Various code lengths may be supported by changing a lifting size. For example, floor lifting or modulo lifting may be used. For example, a parity check matrix according to modulo lifting may be obtained as indicated by the following equation.

$$H_Q = \begin{cases} a_{ij} \text{MOD } Q & \text{if } a_{ij} \neq -1 \\ -1 & \text{if } a_{ij} = -1 \end{cases} \quad \text{Equation 4}$$

In the above equation, Q denotes a lifting size and $a_{ij}$ denotes a shift value of the i-th row and the j-th column of a preset parity check matrix (refer to FIG. 8). In addition, MOD Q denotes a modulo operation based on the value Q. That is, in a circular shift matrix of the preset parity check matrix, values corresponding to the zero matrix are maintained and a modulo operation based on the lifting size Q is performed with respect to the other circular shift values. Therefore, shift values of the circular shift matrix are converted into values equal to or greater than −1 and equal to or less than Q−1.

Figure 13:
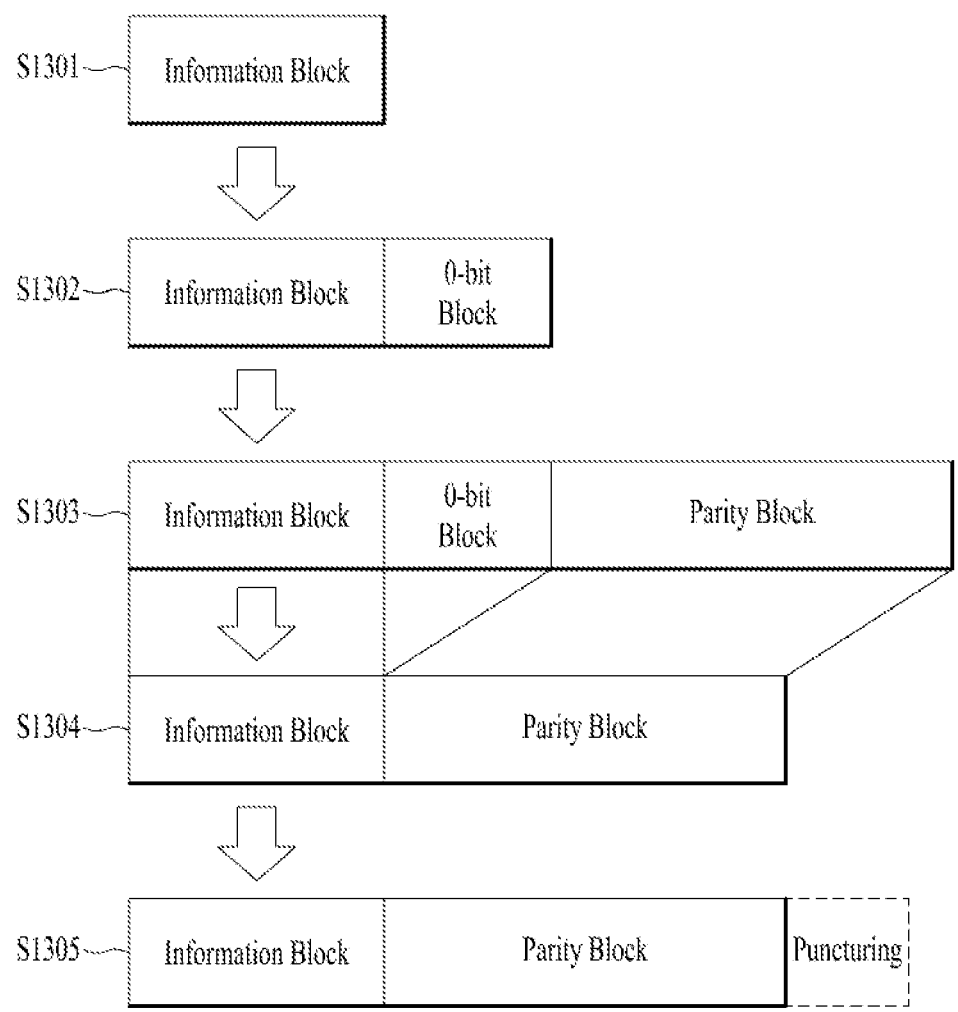
FIG. 13 is a diagram illustrating an exemplary rate matching procedure.

FIG. 13 is a diagram illustrating an exemplary rate matching procedure.

The length of data bits capable of being substantially transmitted may be determined based on the size of available physical resources. Accordingly, a codeword having a code rate corresponding to the size of available physical resources may be generated through rate matching. For example, a shortening scheme or puncturing scheme may be used for rate matching. The shortening scheme may be performed, for example, by removing a part of an information part of the codeword. Since a part of information bits is reduced, a code rate may be reduced by the shortening scheme. The puncturing scheme may be performed, for example, by puncturing at least a part of a parity of the codeword. In puncturing, since the rate of the information bits increases, the code rate may increase. Therefore, theoretically, a codeword corresponding to an arbitrary code rate may be generated through a combination of the shortening scheme and the puncturing scheme.

Shortening and puncturing performance may be determined according to an order of shortened or punctured bits. However, in the QC LDPC code, an order of bit puncturing within a unit block of Q×Q does not affect performance. Therefore, after interleaving of the unit of the lifting size Q for a parity block is performed, puncturing may be performed from the last part of parity bits. In addition, shortening may be performed from the last part of the information bits.

Meanwhile, if the size of physical resources is greater than the length of an encoded LDPC code, rate matching may be performed through an iteration scheme.

Referring to FIG. 13, first, an information block including information bits to be transmitted is generated (step S1301). If the size of a CB is less than the length of an LDPC information part, 0-bit information may be added to the end of the information block prior to encoding. In the example of FIG. 13, a 0-bit block is inserted into the end of the information block for later shortening (step S1302). Next, encoding is performed based on the LDPC code with respect to the information block and the 0-bit block so that a codeword including a parity block may be generated (step S1303). In step S1303, the information block and the 0-bit block may correspond to an information part of the LDPC code and the parity block may correspond to a parity part of the LDPC code.

As described above, the shortening scheme may be applied for rate matching. In this case, the already inserted 0-bit block may be removed (step S1304). In addition, for puncturing described later, interleaving (permutation) of a lifting size unit may be performed with respect to the parity block. In addition, for rate matching, the last part of the parity block may be punctured (step S1305).

A 5G wireless LAN system supports a transmission rate from a maximum of 20 Gbps to a minimum of a few tens of bps (up to 40 bps in LTE). As such, a transmission environment supported by the 5G wireless LAN system is diverse. To efficiently encode information in such various environments, the LDPC code used for encoding should support various code rates. However, when information is encoded using one LDPC code as performed conventionally, a problem of inefficiency arises in terms of coping with the various communication environments.

The present invention proposes that the LDPC code use multiple base codes in order to provide effective encoding in various communication environments.

A few base codes proposed in the present invention may be base codes favorable for a large TB (large block) and a large amount of throughput or base codes favorable for small TB (small block) and short latency.

Unlike the turbo code, the LDPC code is disadvantageous in that rows of the matrix H to be processed increase as a code rate is lowered. For example, when the code rate of the LDPC code is 8/9, the number of rows to be processed by an encoder is 6, whereas, when the code rate is reduced to 2/3 under the same condition, the number of rows to be processed by the encoder increases by 18. As the number of rows to be processed increases threefold, latency also increases threefold.

In order to overcome these problems, the present invention proposes introducing an additional short code for encoding a small TB. As such multiple base codes are introduced, gain can be obtained in terms of decoding latency and power consumption.

A data packet transmitted between a BS and a UE has different characteristics depending upon whether the data packet is transmitted on uplink or downlink. When the data packet is transmitted on downlink, since the data packet transmitted on downlink has a relatively high code rate as compared with the data packet transmitted on uplink, large TB blocks occupy most of the traffic. Meanwhile, when the data packet is transmitted on uplink, relatively small TB blocks occupy most of the traffic.

In consideration of these characteristics, if an encoder of a transmitter encodes information using an LDPC code suitable for each communication environment, latency can be effectively reduced.

The present invention proposes a method for the encoder of the transmitter to generate an LDPC code using a partial row-orthogonal structure. Herein, the partial row-orthogonal LDPC structure may refer to an LDPC structure in which only partial layers among different layers constituting the LDPC code have a row-orthogonal structure. Hereinbelow, the row orthogonal structure and the partial row-orthogonal structure proposed in the present invention will be described in detail.

LDPC Code Structure Using Row-Orthogonal Structure

Figure 14:
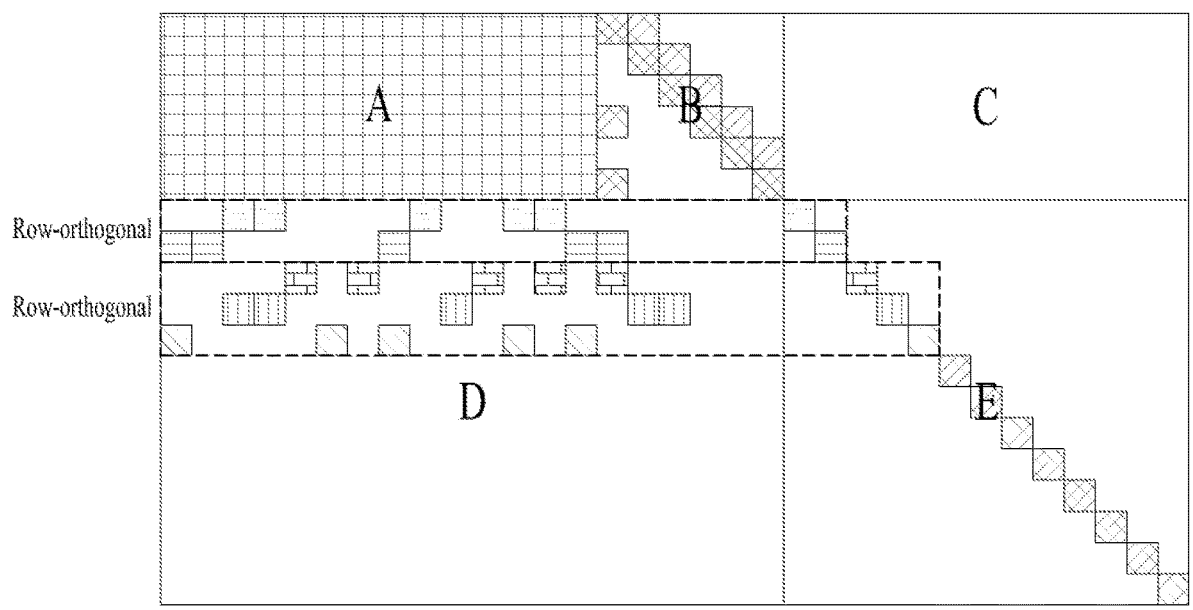
FIG. 14 is a diagram referenced to explain an LDPC code structure using a row-orthogonal structure.

FIG. 14 is a diagram referenced to explain an LDPC code structure using a row-orthogonal structure.

In the row-orthogonal structure, edges within a layer constituting a parity check matrix D of LDPC are designed not to overlap upward and downward with respect to consecutive rows, as illustrated in FIG. 14. Herein, the layer may mean a set of one or multiple rows.

The row-orthogonal structure will now be described in more detail with reference to the example illustrated in FIG. 14. Among dotted line regions illustrated in FIG. 14, a first layer located at an upper part is configured such that two rows constitute one layer and a second layer located at a lower part is configured such that three rows constitute one layer.

In this case, since edges constituting the first layer and edges constituting the second layer are configured not to overlap upward and downward between consecutive rows, both the first layer and the second layer may be defined as having a row-orthogonal structure.

However, since this structure may cause memory collision between the first layer and the second layer, it is not effective to reduce latency. In addition, in the row-orthogonal structure, since locations of edges within a matrix are limited so that edges do not overlap (column values are not the same) with respect to consecutive rows as described earlier, performance degradation of an entire system occurs.

Hereinafter, an LDPC code structure according to an embodiment of the present invention, proposed to solve the above problems, will be described. Specifically, a method of generating an LDPC code using a partial row-orthogonal structure in which only partial layers of a single parity check matrix are configured as a row-orthogonal structure will be described.

LDPC Code Structure Using Partial Row-Orthogonal Structure

Figure 15:
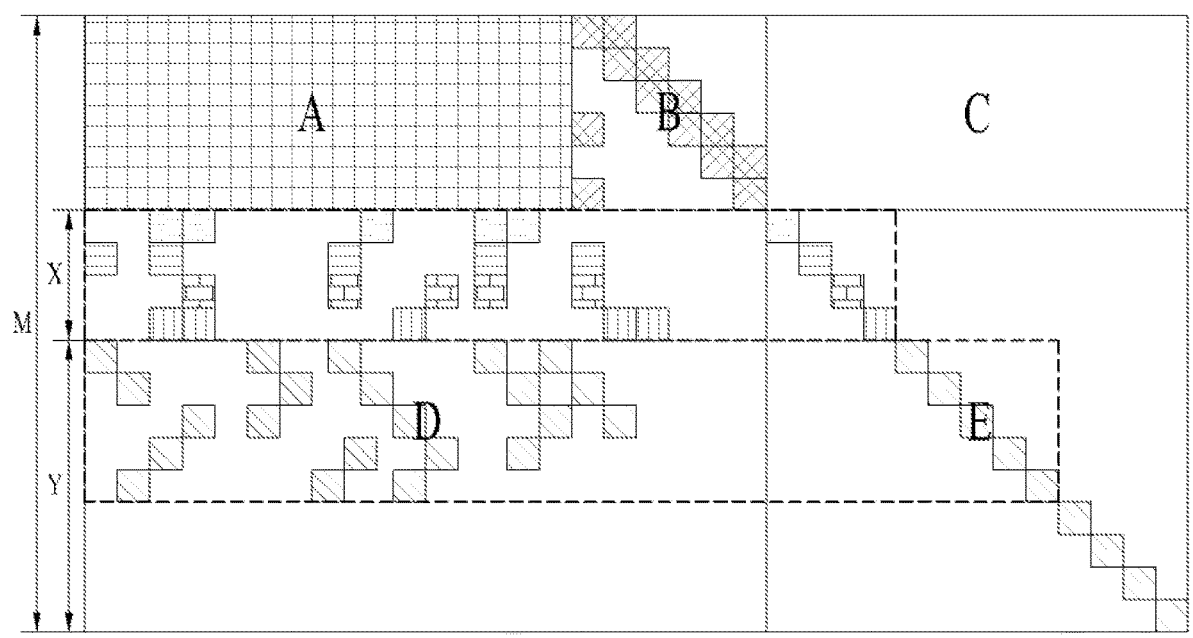
FIG. 15 is a diagram referenced to explain a partial row-orthogonal LDPC code structure which is usable in some embodiments of the present invention.

FIG. 15 is a diagram referenced to explain a partial row-orthogonal LDPC code structure which is usable in some embodiments of the present invention. The partial row-orthogonal structure may be designed using the following characteristics of the LDPC code.

Since the number of rows to be processed increases as a code rate becomes lower, great gain of decoding latency of the LDPC code may be obtained at a low code rate.

As a code rate becomes lower, a parity check matrix D illustrated in FIG. 15 has an increased spare space for locations of edges. Therefore, a row-orthogonal edge arrangement structure may be designed without the aforedescribed performance degradation.

To minimize memory collision between layers as described above, edges are designed so as not to overlap at a boundary between different layers.

In consideration of this point, the partial row-orthogonal structure may be designed such that edges between different rows in a part having a high code rate in the matrix D overlap, i.e., do not have a row-orthogonal structure, rather than all layers of the matrix D are designed to be row-orthogonal. In a part having a low code rate in the matrix D, edges between different rows may be designed not to overlap, i.e., the edges between different rows may be designed to have the row-orthogonal structure.

Thus, when the row-orthogonal structure is used only for a partial portion having a low code rate of an LDPC code by segmenting the configuration of the parity check matrix, row-orthogonal performance degradation caused by edge selection and memory collision can be reduced. That is, a partial portion having a high code rate provides a wide choice of edges to offset latency degradation.

X illustrated in FIG. 15 means that there is a duration (having the same column value) in which edges between consecutive rows overlap in a region corresponding to X upper rows in the parity check matrix D. That is, this means that the row-orthogonal structure is not designed in a region corresponding to the X upper rows in the parity check matrix D.

In a region consisting of X rows in the matrix D, edges positioned between the rows overlap so that signals cannot be fully pipelined. Therefore, latency may increase during decoding. However, in a lower region consisting of Y rows, since edges positioned between the rows do not overlap, signals may be fully pipelined. Then latency decreases during decoding. That is, latency gain can be obtained.

As a row-orthogonal structure for balancing performance and latency, a quasi-row-orthogonal structure may be used. The quasi-row-orthogonal structure refers to a row-orthogonal structure in which edges overlap only in a puncturing region and edges do not overlap in the other regions. For decoding of the quasi-row-orthogonal structure, a system may require additional logic in addition to a conventional layered decoding method.

Hereinafter, a method of determining the above-described values X and Y will be described.

The following Table 1 shows parameters of base graphs that can be used as an embodiment of the present invention, and proposes several parameters of the first base code and the second base code which form the base graphs. However, the features of the present invention are not limited to the parameters proposed by the table.

TABLE 1

| Base code | Size $M_b \times N_b$ | Code Rate | $P_b$ | Max information | Kb,max/ Kb,min | Lifting Values (Z) |
|---|---|---|---|---|---|---|
| BC1 | 6 × 38 | 0.89 | 2 | 8192 | 32/24 | 256, 192, 144, 108, 82 |
| BC2 | 6 × 16 | 0.71 | 2 | 2040 | 10/6 | 204, 128, 88, 56, 36, 24, 16, 10, 6 |

In the above table, Mb denotes the size of a parity of each base code and Nb denotes the size of a codeword of each base code. In addition, Pb denotes the puncturing size of each base code. Kb,max denotes a maximum value of the number of columns of each base code and Kb,min denotes a minimum value of the number of columns of each base code.

First, X and Y may be determined based on a ratio considering an amount (a total number of rows) of the entire base code.

For example, assuming that a base graph as shown in Table 1 is provided and the lowest code rate of the first base code is 1/3, the number of rows may be set to 66. In this case, if a parity bit matrix is generated starting from 1/3 of all rows through the row-orthogonal structure, then X may be 22 (=66/(1/3)) and Y may be 44 (=66–22).

Second, a code rate requiring the row-orthogonal structure may be predetermined and the row-orthogonal structure may be applied to rows starting from a row of a parity check matrix corresponding to the predetermined code rate.

For example, in the above example, if it is desired to apply the row-orthogonal structure to a matrix starting from a code rate of 2/3, X may be 18 (=32/(2/3)–(32–2)) and Y may be 48 (=66–18). In this case, puncturing of 2Z is considered.

Third, a method of determining X and Y of the parity check matrix having a row-orthogonal structure when a base code is small in size will now be described.

For example, a situation in which the base graph as shown in Table 1 is provided and the second base code is used may be considered. If an LDPC code supports a very low code rate even when the base code is small in size, since the number of rows constituting the parity check matrix is large, a partial portion of the parity check matrix may have the row-orthogonal structure in order to reduce decoding latency. In this case, a code rate at which the row-orthogonal structure is started is lower than that in a base code having a large size (in the above example, the first base code).

In the above example, assuming that a minimum code rate of the second base code is 1/5, a total number of rows may be 10/(1/5)=50. If the row-orthogonal structure is applied to rows starting from a code rate of about 1/2, X may be 18 (=10/(1/2)–(10–2)) and Y may be 32 (=50-18).

Recently, the 3GPP standard has provided proposals for an LDPC code structure of a partial row-orthogonal structure. Hereinafter, some embodiments of the present invention according to the above proposals will be described.

Figure 16:
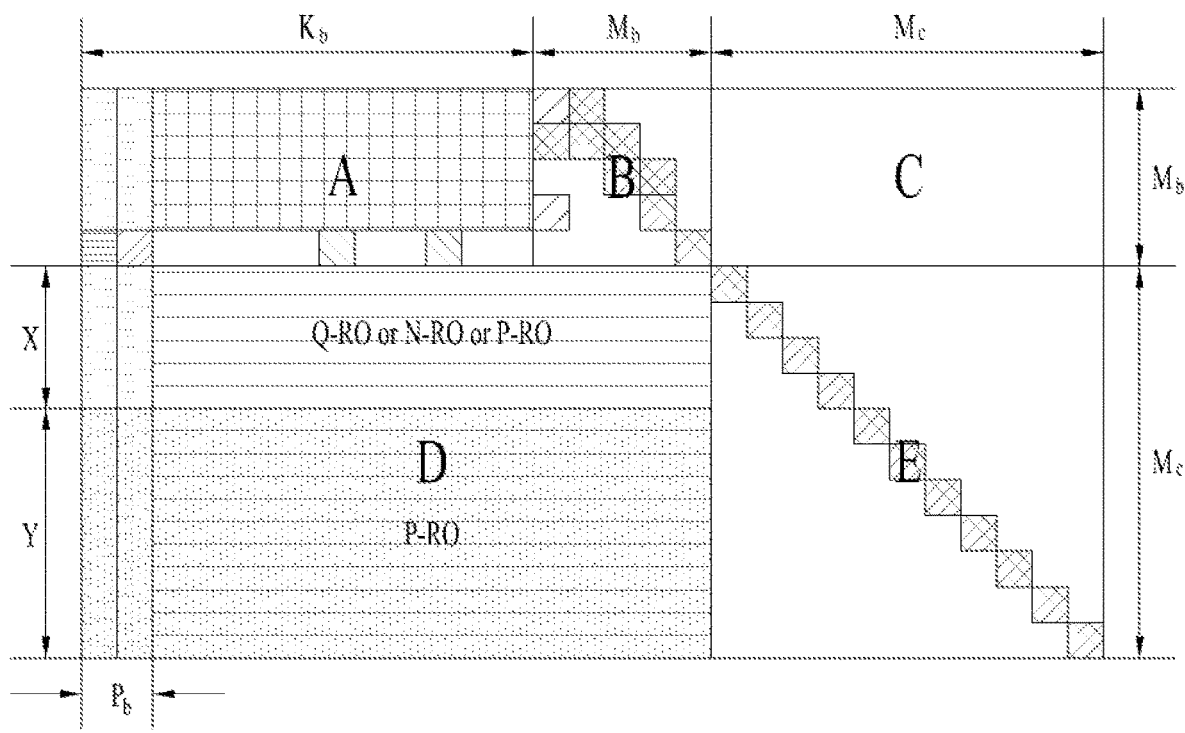
FIG. 16 is a diagram illustrating a partial row-orthogonal LDPC code structure according to an embodiment of the present invention.
Figure 17:
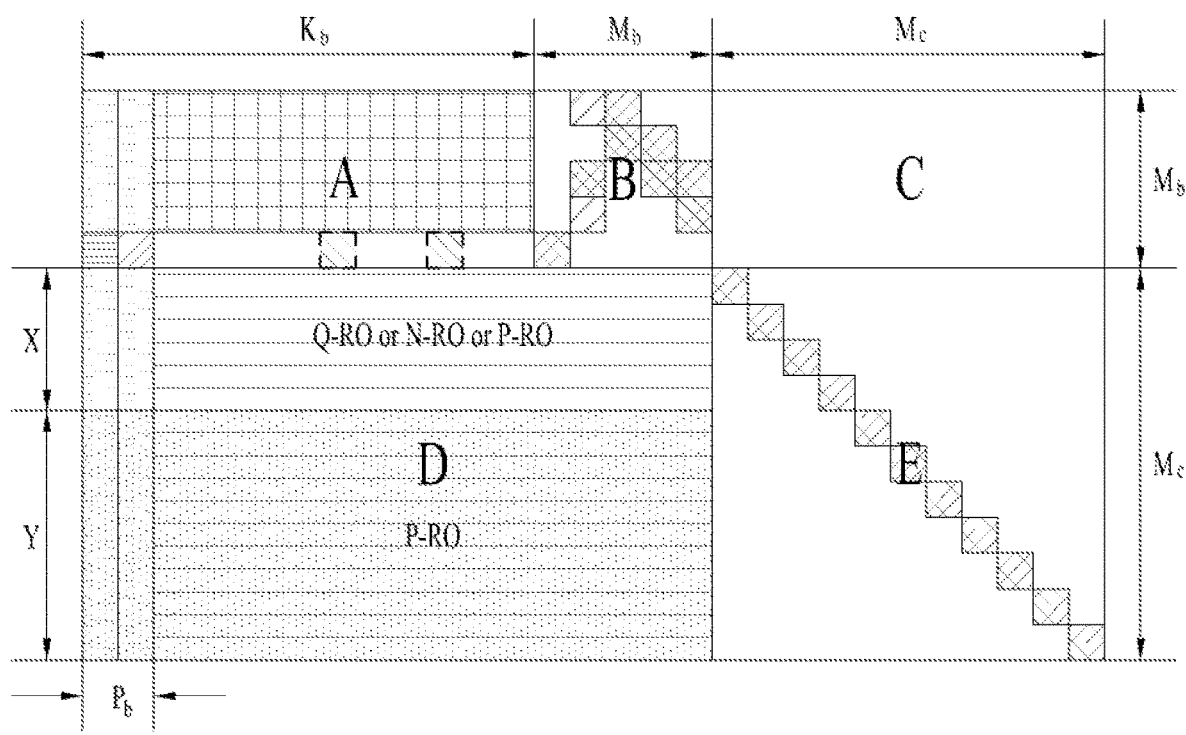
FIG. 17 is a diagram illustrating another partial row-orthogonal LDPC code structure according to an embodiment of the present invention.

FIG. 16 is a diagram illustrating a partial row-orthogonal LDPC code structure according to an embodiment of the present invention. FIG. 17 is a diagram illustrating another partial row-orthogonal LDPC code structure according to an embodiment of the present invention.

Hereinafter, the LDPC code structure proposed according to an embodiment of the present invention, illustrated in FIGS. 16 and 17, will be described.

In terms of performance, the LDPC code structure according to an embodiment of the present invention may be proposed as follows. The proposed LDPC code structure may be a structure for securing performance having a code rate of 0.89 to 0.93. To satisfy a code rate of 0.89, a matrix A and a matrix B are desirably configured to have a size of 5*27 (including 2-column puncturing). In the 5*27 matrix, a parity matrix having a dual-diagonal structure is desirably determined to have a size of 4*4. In the 5*27 matrix, a degree-1 variable node may be included in the parity matrix. In addition, 2-column puncturing may be adjacently configured to a check node (the last rows of the matrix A and the matrix B) of the degree-1 variable node.

In relation to the matrix D of the LDPC code structure proposed according to the embodiment, quasi-row-orthogonal, non-row-orthogonal, and pure row-orthogonal structures may be configured up to X random rows. Herein, the non-row-orthogonal structure means that the entire region of a specific region is configured with a structure other than the row-orthogonal structure and the pure row-orthogonal means that the entire region of a specific region is configured with the row-orthogonal structure. In this case, the other Y rows may be configured with the pure row-orthogonal structure.

In terms of complexity, the structure according to the embodiment of the present invention may be proposed as follows. A total number of edges included in the LDPC code structure may be limited to about 300 to 310. More specifically, in order for the LDPC code structure to support a code rate of 1/3, a total number of edges included in the LDPC code structure may be limited to about 300 to 310. In this case, to secure throughput at a low code rate, it is desirable to use the pure row-orthogonal structure in the Y rows. In some case, either X or Y may have a value of 0.

Figure 18:
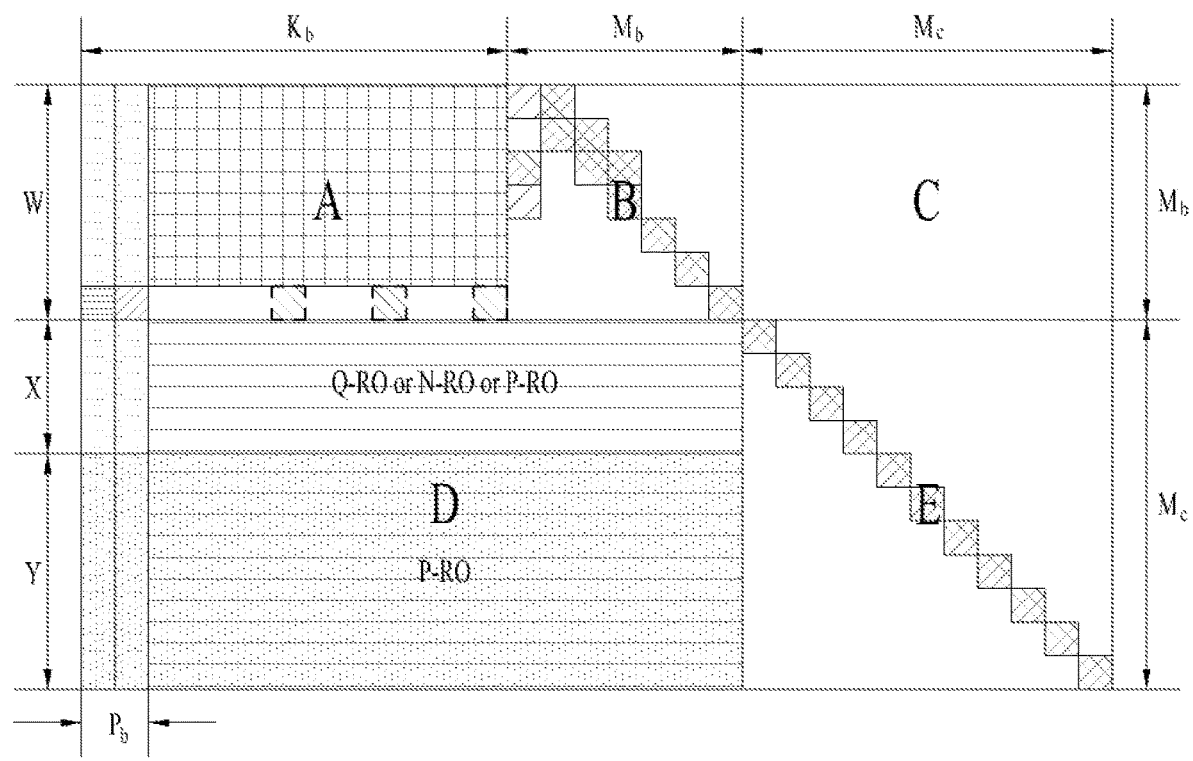
FIG. 18 is a diagram illustrating a partial row-orthogonal LDPC code structure according to another embodiment of the present invention.

FIG. 18 is a diagram illustrating a partial row-orthogonal LDPC code structure according to another embodiment of the present invention.

Hereinbelow, the LDPC code structure proposed according to another embodiment of the present invention, illustrated in FIG. 18, will be described.

In terms of performance, the LDPC code structure according to another embodiment of the present invention may be proposed as follows. The proposed LDPC code structure may be a structure for securing performance having a code rate of 0.67 (=2/3). To satisfy a code rate of 0.89, a matrix A and a matrix B are desirably configured to have a size of 7*17 (including 2-column puncturing). In the 7*17 matrix, a parity matrix having a dual-diagonal structure is desirably determined to have a size of 4*4. In the 7*17 matrix, a degree-1 variable node may be included in the parity matrix. If there is a large number of degree-1 nodes, waterfall region performance may be excellent but error floor performance may be reduced. According to another embodiment of the present invention, three degree-1 nodes may be proposed and three nodes of a right lower part constituting the matrix B may be configured as the degree-1 nodes. In addition, 2-column puncturing may be adjacently configured to a check node (the last rows of the matrix A and the matrix B) of the degree-1 variable node.

In relation to a matrix D of the LDPC code structure proposed according to another embodiment, the quasi-row-orthogonal, non-row-orthogonal, and pure row-orthogonal structures may be configured up to X random rows. Herein, the non row-orthogonal structure means that the entire region of a specific region is configured with a structure other than the row-orthogonal structure and the pure row-orthogonal means that the entire region of a specific region is configured with the row-orthogonal structure. In this case, the other Y rows may be configured with the pure row-orthogonal structure. In some cases, either X or Y may have a value of 0.

In terms of complexity, the structure according to another embodiment of the present invention may be proposed as follows. A total number of edges included in the LDPC code structure may be limited to about 190 to 195. More specifically, in order for the LDPC code structure to support a code rate of 1/5, a total number of edges included in the LDPC code structure may be limited to about 190 to 195. In this case, to secure throughput at a low code rate, it is desirable to use the pure row-orthogonal structure in the Y rows. In some cases, either X or Y may have a value of 0.

According to the above-described embodiment, when X and Y are configured with respect to each code rate, criteria of parameters and code rates illustrated in FIG. 18 may be configured as indicated in Table 2.

TABLE 2

High rate: ~2/3, W = 7
Middle rate: ~1/3, X = 22
Low rate: ~1/5, Y = 20

In addition, the LDPC code structure according to another embodiment of the present invention, illustrated in FIG. 18, may be proposed according to parameters shown in Table 3

TABLE 3

| Kb | Mb | Mc | Pb | W | X | Y | X + Y |
|---|---|---|---|---|---|---|---|
| 10 | 7 | 42 | 2 | 7 | [22] | [20] | 42 |

While the LDPC code structure according to the embodiment of the present invention has been described, the scope of the present invention is not limited by the above-described numbers or figures. Embodiments of various forms including the above-described features of the present invention may be within scope of the present invention.

Figure 19:
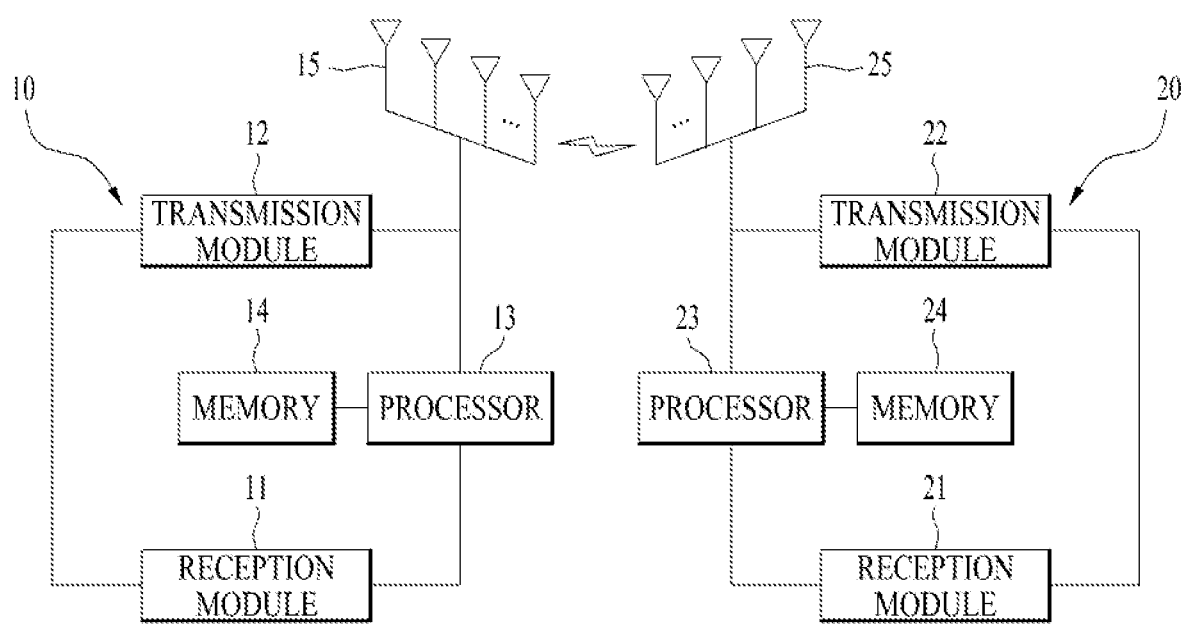
FIG. 19 is a diagram referenced to explain a device according to an embodiment of the present invention.

FIG. 19 is a diagram referenced to explain a device according to an embodiment of the present invention.

Referring to FIG. 19, a BS 10 according to the present invention may include a reception module 11, a transmission module 12, a processor 13, a memory 14, and a plurality of antennas 15. The transmission module 12 may transmit a variety of signals, data, and information to an external device (e.g., UE). The reception module 11 may receive a variety of signals, data, and information from the external device (e.g., UE). The reception module 11 and the transmission module 12 may be referred to as a transceiver. The processor 13 may control overall operation of the BS 10. The plural antennas 15 may be configured according to, for example, a 2-dimensional antenna arrangement.

The processor 13 of the BS 10 according to an example of the present invention may be configured to receive channel state information according to the examples proposed in the present invention. The processor 13 of the BS 10 processes information received by the BS 10 and information to be transmitted to the outside of the BS 10. The memory 14 may store the processed information for a predetermined time and may be replaced with a component such as a buffer (not shown).

Referring to FIG. 19, a UE 20 according to the present invention may include a reception module 21, a transmission module 22, a processor 23, a memory 24, and a plurality of antennas 25. Use of the plurality of antennas 25 means that the UE 20 supports Multiple Input Multiple Output (MIMO) transmission and reception using the plurality of antennas 25. The transmission module 22 may transmit a variety of signals, data, and information to an external device (e.g., BS). The reception module 21 may receive a variety of signals, data, and information from the external device (e.g., BS). The reception module 21 and the transmission module 22 may be referred to as a transceiver. The processor 23 may control overall operation of the BS 10.

The processor 23 of the UE 20 according to an example of the present invention may be configured to transmit channel state information according to the examples proposed in the present invention. The processor 23 of the UE 20 processes information received by the UE 20 and information to be transmitted to the outside of the UE 20. The memory 24 may store the processed information for a predetermined time and may be replaced with a component such as a buffer (not shown).

The detailed configurations of the UE 20 may be implemented such that the above-described various embodiments of the present invention are independently applied or two or more embodiments of the present invention are simultaneously applied. Redundant matters will not be described herein for clarity.

In described various embodiments of the present invention, while the BS has been mainly described as an example of a downlink transmission entity or an uplink reception entity and the UE has been mainly described as an example of a downlink reception entity or an uplink transmission entity, the scope of the present invention is not limited thereto. For example, a description of the BS may be identically applied when a cell, an antenna port, an antenna port group, a remote radio head (RRH), a transmission point, a reception point, an access point, or a relay is a downlink transmission entity to the UE or an uplink reception entity from the UE. In addition, the principle of the present invention described through various embodiments of the present invention may be identically applied to a relay acting as a downlink transmission entity to the UE or an uplink reception entity from the UE, or a relay acting as an uplink transmission entity to the BS or a downlink reception entity from the BS.

The embodiments of the present invention may be implemented by various means, for example, hardware, firmware, software, or a combination thereof.

In a hardware configuration, the method according to the embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, or microprocessors.

In a firmware or software configuration, the method according to the embodiments of the present invention may be implemented in the form of modules, procedures, functions, etc. performing the above-described functions or operations. Software code may be stored in a memory unit and executed by a processor. The memory unit may be located at the interior or exterior of the processor and may transmit and receive data to and from the processor via various known means.

The embodiments described above are combinations of components and features of the present invention in a prescribed form. Each component or feature may be considered selective unless explicitly mentioned otherwise. Each component or feature may be executed in a form that is not combined with other components and features. Further, some components and/or features may be combined to configure an embodiment of the present invention. The order of operations described in the embodiments of the present invention may be changed. Some components or features of an embodiment may be included in another embodiment or may be substituted with a corresponding component or feature of the present invention. It is obvious to those skilled in the art that claims that are not explicitly cited in each other in the appended claims may be presented in combination as an embodiment of the present invention or included as a new claim by subsequent amendment after the application is filed.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all changes which come within the equivalent scope of the invention are within the scope of the invention.

The embodiments of the present invention are applicable to various wireless access systems and broadcast communication systems. The wireless access systems include, for example, a 3GPP system, a 3GPP2 system, and/or an IEEE 802.xx system. The embodiments of the present invention may be applied not only to the wireless access systems but also to all technical fields employing the wireless access systems.

What is claimed is:

1. A method of transmitting, by a communication device, an information block in a wireless communication system, the method comprising:

encoding, by the communication device, the information block based on a low density parity check (LDPC) code matrix $$H = \begin{bmatrix} A & B & C \\ D & E \end{bmatrix};$$

and transmitting, by the communication device, the encoded information block, wherein each element of the LDPC code matrix represents a Z*Z zero matrix, or a Z*Z circulant permutation matrix obtained by circularly shifting a Z*Z identity matrix to the right a non-negative integer number of times, wherein "[A B]" is a $M_b*(K_b+M_b)$ matrix, wherein "B" is a $M_b*M_b$ dual diagonal matrix, in which every element of "B" represents the Z*Z zero matrix except for $M_b$ elements at a first diagonal of "B", ($M_b-1$) elements at a second diagonal right above the first diagonal of "B" and two elements below the first diagonal of "B" in a first column of "B", wherein "C" is a $M_b*M_c$ matrix, in which every element of "C" represents the Z*Z zero matrix, wherein "E" is a $M_c*M_c$ single diagonal matrix, in which every element of "E" represents the Z*Z zero matrix except for $M_c$ elements at a diagonal of "E", wherein "D" is a $M_c*(K_b+M_b)$ matrix consisting of ($M_c-Y$) upper rows and Y lower rows, where ($M_c-Y$) is a positive integer, wherein the Y lower rows are a row orthogonal structure in which every two consecutive rows of the Y lower rows have at most one element not representing the Z*Z zero matrix in each column, and wherein the ($M_c-Y$) upper rows are a quasi-row orthogonal structure in which:

i) every two consecutive rows of the ($M_c-Y$) upper rows have at most one element representing a Z*Z circulant permutation matrix in each column, except for 2 leftmost columns of "D"; and ii) for each row i of the ($M_c-Y$) upper rows, where i=1, . . . , $M_c-Y$, the row i and a row right above the row i or the row i and a row right below the row i have more than one element representing a Z*Z circulant permutation matrix in at least one of the 2 leftmost columns.

2. The method according to claim 1, wherein "A" is not a row orthogonal structure.

3. A communication device for transmitting an information block in a wireless communication system, the communication device comprising:

at least one processor; and at least one memory storing at least one code that causes the at least one processor to perform operations comprising:

encoding the information block based on a low density parity check (LDPC) code matrix $$H = \begin{bmatrix} A & B & C \\ D & E \end{bmatrix};$$

and transmitting the encoded information block, wherein each element of the LDPC code matrix represents a Z*Z zero matrix, or a Z*Z circulant permutation matrix obtained by circularly shifting a Z*Z identity matrix to the right a non-negative integer number of times, wherein "[A B]" is a $M_b*(K_b+M_b)$ matrix, wherein "B" is a $M_b*M_b$ dual diagonal matrix, in which every element of "B" represents the Z*Z zero matrix except for $M_b$ elements at a first diagonal of "B", ($M_b-1$) elements at a second diagonal right above the first diagonal of "B" and two elements below the first diagonal of "B" in a first column of "B", wherein "C" is a $M_b*M_c$ matrix, in which every element of "C" represents the Z*Z zero matrix, wherein "E" is a $M_c*M_c$ single diagonal matrix, in which every element of "E" represents the Z*Z zero matrix except for $M_c$ elements at a diagonal of "E", wherein "D" is a $M_c*(K_b+M_b)$ matrix consisting of ($M_c$–Y) upper rows and Y lower rows, where ($M_c$–Y) is a positive integer, wherein the Y lower rows are a row orthogonal structure in which every two consecutive rows of the Y lower rows have at most one element not representing the Z*Z zero matrix in each column, and wherein the ($M_c$–Y) upper rows are a quasi-row orthogonal structure in which:
  i) every two consecutive rows of the ($M_c$–Y) upper rows have at most one element representing a Z*Z circulant permutation matrix in each column, except for 2 leftmost columns of "D"; and
  ii) for each row i of the ($M_c$–Y) upper rows, where i=1, . . . , $M_c$–Y, the row i and a row right above the row i or the row i and a row right below the row i have more than one element representing a Z*Z circulant permutation matrix in at least one of the 2 leftmost columns.

4. The communication device according to claim 3, wherein "A" is not a row orthogonal structure.

5. A method of receiving, by a communication device, an information block in a wireless communication system, the method comprising:
  receiving, by the communication device, an encoded information block; and
  decoding, by the communication device, the encoded information block based on a low density parity check (LDPC) code matrix $$H = \begin{bmatrix} A & B & C \\ D & E \end{bmatrix}$$

to produce the information block, wherein each element of the LDPC code matrix represents a Z*Z zero matrix, or a Z*Z circulant permutation matrix obtained by circularly shifting a Z*Z identity matrix to the right a non-negative integer number of times, wherein "[A B]" is a $M_b*(K_b+M_b)$ matrix, wherein "B" is a $M_b*M_b$ dual diagonal matrix, in which every element of "B" represents the Z*Z zero matrix except for $M_b$ elements at a first diagonal of "B", ($M_b$–1) elements at a second diagonal right above the first diagonal of "B" and two elements below the first diagonal of "B" in a first column of "B", wherein "C" is a $M_b*M_c$ matrix, in which every element of "C" represents the Z*Z zero matrix, wherein "E" is a $M_c*M_c$ single diagonal matrix, in which every element of "E" represents the Z*Z zero matrix except for $M_c$ elements at a diagonal of "E", wherein "D" is a $M_c*(K_b+M_b)$ matrix consisting of ($M_c$–Y) upper rows and Y lower rows, where ($M_c$–Y) is a positive integer, wherein the Y lower rows are a row orthogonal structure in which every two consecutive rows of the Y lower rows have at most one element not representing the Z*Z zero matrix in each column, and wherein the ($M_c$–Y) upper rows are a quasi-row orthogonal structure in which:
  i) every two consecutive rows of the ($M_c$–Y) upper rows have at most one element representing a Z*Z circulant permutation matrix in each column, except for 2 leftmost columns of "D"; and
  ii) for each row i of the ($M_c$–Y) upper rows, where i=1, . . . , $M_c$–Y, the row i and a row right above the row i or the row i and a row right below the row i have more than one element representing a Z*Z circulant permutation matrix in at least one of the 2 leftmost columns.

6. The method according to claim 5, wherein "A" is not a row orthogonal structure.

7. A communication device for receiving an information block in a wireless communication system, the communication device comprising:
  at least one processor; and
  at least one memory storing at least one code that causes the at least one processor to perform operations comprising:
  receiving an encoded information block; and
  decoding the encoded information block based on a low density parity check (LDPC) code matrix $$H = \begin{bmatrix} A & B & C \\ D & E \end{bmatrix}$$

to produce the information block, wherein each element of the LDPC code matrix represents a Z*Z zero matrix, or a Z*Z circulant permutation matrix obtained by circularly shifting a Z*Z identity matrix to the right a non-negative integer number of times, wherein "[A B]" is a $M_b*(K_b+M_b)$ matrix, wherein "B" is a $M_b*M_b$ dual diagonal matrix, in which every element of "B" represents the Z*Z zero matrix except for $M_b$ elements at a first diagonal of "B", ($M_b$–1) elements at a second diagonal right above the first diagonal of "B" and two elements below the first diagonal of "B" in a first column of "B", wherein "C" is a $M_b*M_c$ matrix, in which every element of "C" represents the Z*Z zero matrix, wherein "E" is a $M_c*M_c$ single diagonal matrix, in which every element of "E" represents the Z*Z zero matrix except for $M_c$ elements at a diagonal of "E", wherein "D" is a $M_c*(K_b+M_b)$ matrix consisting of ($M_c$–Y) upper rows and Y lower rows, where ($M_c$–Y) is a positive integer, wherein the Y lower rows are a row orthogonal structure in which every two consecutive rows of the Y lower rows have at most one element not representing the Z*Z zero matrix in each column, and wherein the ($M_c$–Y) upper rows are a quasi-row orthogonal structure in which:
  i) every two consecutive rows of the ($M_c$–Y) upper rows have at most one element representing a Z*Z circulant permutation matrix in each column, except for 2 leftmost columns of "D"; and
  ii) for each row i of the ($M_c$–Y) upper rows, where i=1, . . . , $M_c$–Y, the row i and a row right above the row i or the row i and a row right below the row i have more than one element representing a Z*Z circulant permutation matrix in at least one of the 2 leftmost columns.

8. The communication device according to claim 7, wherein "A" is not a row orthogonal structure.

9. A non-transitory computer readable medium and comprising at least one code that, when executed, causes at least one processor to perform operations for a communication device, the operations comprising:
encoding, by the communication device, an information block based on a low density parity check (LDPC) code matrix $$H = \begin{bmatrix} A & B & C \\ D & E \end{bmatrix};$$

and
transmitting, by the communication device, the encoded information block,
wherein each element of the LDPC code matrix represents a Z*Z zero matrix, or a Z*Z circulant permutation matrix obtained by circularly shifting a Z*Z identity matrix to the right a non-negative integer number of times,
wherein "[A B]" is a $M_b*(K_b+M_b)$ matrix,
wherein "B" is a $M_b*M_b$ dual diagonal matrix, in which every element of "B" represents the Z*Z zero matrix except for $M_b$ elements at a first diagonal of "B", $(M_b-1)$ elements at a second diagonal right above the first diagonal of "B" and two elements below the first diagonal of "B" in a first column of "B",
wherein "C" is a $M_b*M_c$ matrix, in which every element of "C" represents the Z*Z zero matrix,
wherein "E" is a $M_c*M_c$ single diagonal matrix, in which every element of "E" represents the Z*Z zero matrix except for $M_c$ elements at a diagonal of "E",
wherein "D" is a $M_c*(K_b+M_b)$ matrix consisting of $(M_c-Y)$ upper rows and Y lower rows, where $(M_c-Y)$ is a positive integer,
wherein the Y lower rows are a row orthogonal structure in which every two consecutive rows of the Y lower rows have at most one element not representing the Z*Z zero matrix in each column, and
wherein the $(M_c-Y)$ upper rows are a quasi-row orthogonal structure in which:
  i) every two consecutive rows of the $(M_c-Y)$ upper rows have at most one element representing a Z*Z circulant permutation matrix in each column, except for 2 leftmost columns of "D"; and
  ii) for each row i of the $(M_c-Y)$ upper rows, where i=1, ..., $M_c-Y$, the row i and a row right above the row i or the row i and a row right below the row i have more than one element representing a Z*Z circulant permutation matrix in at least one of the 2 leftmost columns.

10. The non-transitory computer readable medium program product according to claim 9,
wherein "A" is not a row orthogonal structure.

* * * * *